(12) United States Patent
Fukui et al.

(10) Patent No.: US 8,119,323 B2
(45) Date of Patent: Feb. 21, 2012

(54) PROCESS FOR PRODUCING PATTERNED FILM AND PHOTOSENSITIVE RESIN COMPOSITION

(75) Inventors: Hiroji Fukui, Osaka (JP); Kenichi Aoki, Funabashi (JP); Kunihiro Ichimura, Yokohama (JP); Minoru Suezaki, Osaka (JP); Toshio Enami, Osaka (JP); Hideaki Ishizawa, Osaka (JP); Takao Unate, Osaka (JP); Hiroshi Kobayashi, Osaka (JP)

(73) Assignee: Sekisui Chemical Co., Ltd., Osaka (JP)

( * ) Notice: Subject to any disclaimer, the term of this patent is extended or adjusted under 35 U.S.C. 154(b) by 542 days.

(21) Appl. No.: 12/304,262

(22) PCT Filed: Oct. 19, 2006

(86) PCT No.: PCT/JP2006/320819
§ 371 (c)(1),
(2), (4) Date: Dec. 10, 2008

(87) PCT Pub. No.: WO2007/144967
PCT Pub. Date: Dec. 21, 2007

(65) Prior Publication Data
US 2009/0202942 A1    Aug. 13, 2009

(30) Foreign Application Priority Data

Jun. 13, 2006 (JP) ................................. 2006-163442
Jul. 19, 2006 (JP) ................................. 2006-197143

(51) Int. Cl.
*G03F 7/00* (2006.01)
*G03F 7/004* (2006.01)

(52) U.S. Cl. .................. 430/270.1; 430/280.1; 430/311; 430/330

(58) Field of Classification Search ............... 430/270.1, 430/280.1, 311
See application file for complete search history.

(56) References Cited

U.S. PATENT DOCUMENTS

| 7,714,162 | B2 * | 5/2010 | Aoki et al. | ..................... | 560/163 |
| 2008/0200580 | A1 * | 8/2008 | Aoki et al. | ..................... | 522/100 |

FOREIGN PATENT DOCUMENTS

JP    06-148895 A    5/1994
(Continued)

OTHER PUBLICATIONS

Machine translation of JP 2006-045523 (no date).*
(Continued)

Primary Examiner — Amanda C. Walke
(74) Attorney, Agent, or Firm — Cheng Law Group, PLLC

(57) ABSTRACT

A process for producing a film pattern, in which a layer of photosensitive resin composition is formed on a substrate and exposed selectively through a mask to light to thereby obtain a film pattern provided on its surface with protrusions and depressions without the need to remove the layer of photosensitive resin composition at unexposed regions or exposed regions by, for example, development; and a photosensitive resin composition for use in the above process for producing a film pattern. There is provided a process for producing a patterned film, comprising the steps of preparing a photosensitive resin composition that upon light irradiation, generates an acid or a base and is hardened; coating substrate (2) with the photosensitive resin composition to thereby form photosensitive resin composition layer (1) of given thickness; and exposing the photosensitive resin composition layer (1) selectively through mask (3) to light so as to travel at least portion of the photosensitive resin composition at unexposed regions toward the exposed regions and further effect hardening thereof, thereby obtaining patterned film (1A) furnished on its surface with protrusion/depression pattern.

8 Claims, 21 Drawing Sheets

FOREIGN PATENT DOCUMENTS

| | | |
|---|---|---|
| JP | 2002-265531 A | 9/2002 |
| JP | 2004-110016 A | 4/2004 |
| JP | 2004-250650 A | 9/2004 |
| JP | 2006-045523 A | 2/2006 |
| WO | WO 2006001518 A2 * | 1/2006 |

OTHER PUBLICATIONS

Machine translation of the examples and claims of JP 2002-265531 (no date).*

International Search Report for the Application No. PCT/JP2006/320819 mailed Feb. 6, 2007.

Aoki, Ken'ichi et al., "Mass Transfer during Anionic UV-curing of Epoxy Resins", Journal of Photopolymer Science and Technology, vol. 19, No. 1, 2006, pp. 49-50.

Aoki, Ken'ichi, "Photopolymer Konwakai Koenkai Yokoshu", Photopolymer Konwakaishi Jimukyoku, Apr. 21, 2006, pp. IV-1-7.

Aoki, Ken'ichi, "Characteristics of Branched Base-Amplifying Oligomer and Application to Photoreactive Material", Collected Papers of the 158th Meeting and Lecture of Photopolymers at Tokyo University of Science (Morito Memorial Hall) on Apr. 21, 2006.

Aoki, Ken'ichi et al., "Mass Transfer during Anionic UV-curing of Epoxy Resins", Collected Papers of the 23th Conference of Photopolymer Science and Technology at Chiba University (Keyaki Kaikan) on Jun. 27, 2006.

Aoki, Ken'ichi et al., "Mass Transfer during Anionic UV-curing of Epoxy Resin Containing Photobase Generator and Base-Amplifier", Collected Papers of the 55th Panel Discussion of Polymer at Toyama University (Gofuku Campus) on Sep. 5, 2006.

* cited by examiner

[FIG. 1]
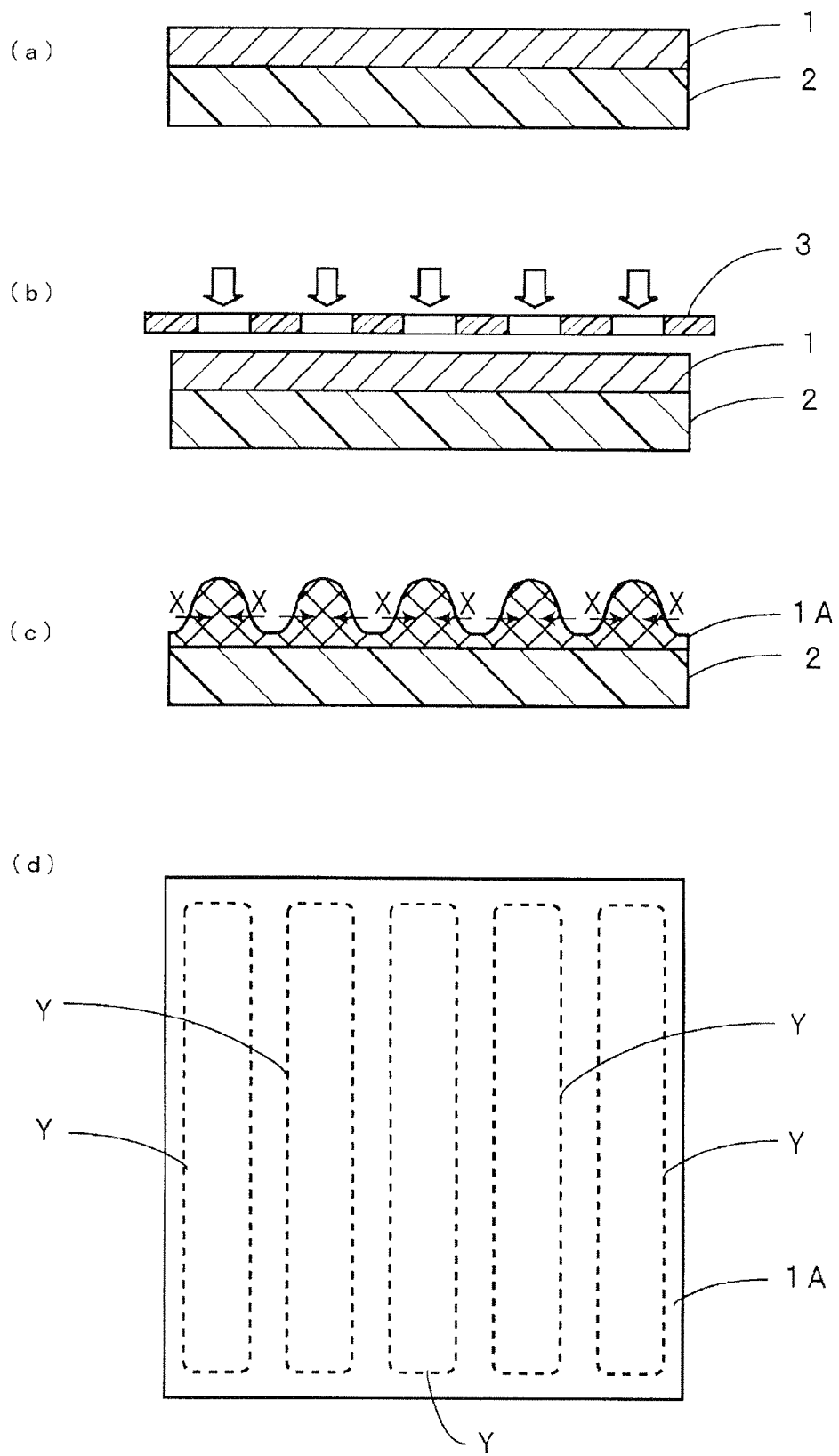

[FIG. 2]
(a)
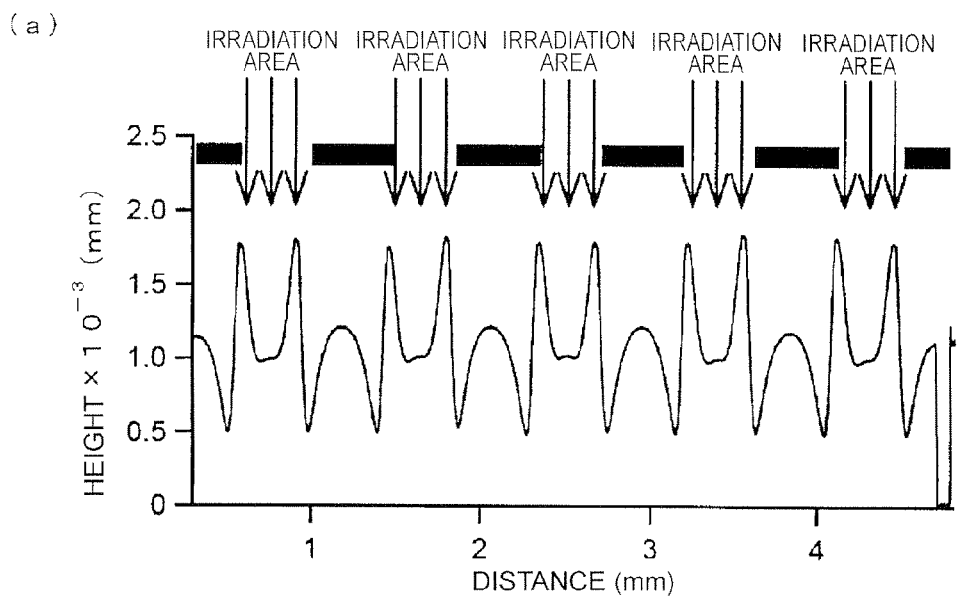
PHOTOMASK WITH 500 μm OF OPENING WIDTH, PEB DURATION 20 MIN.
(b)
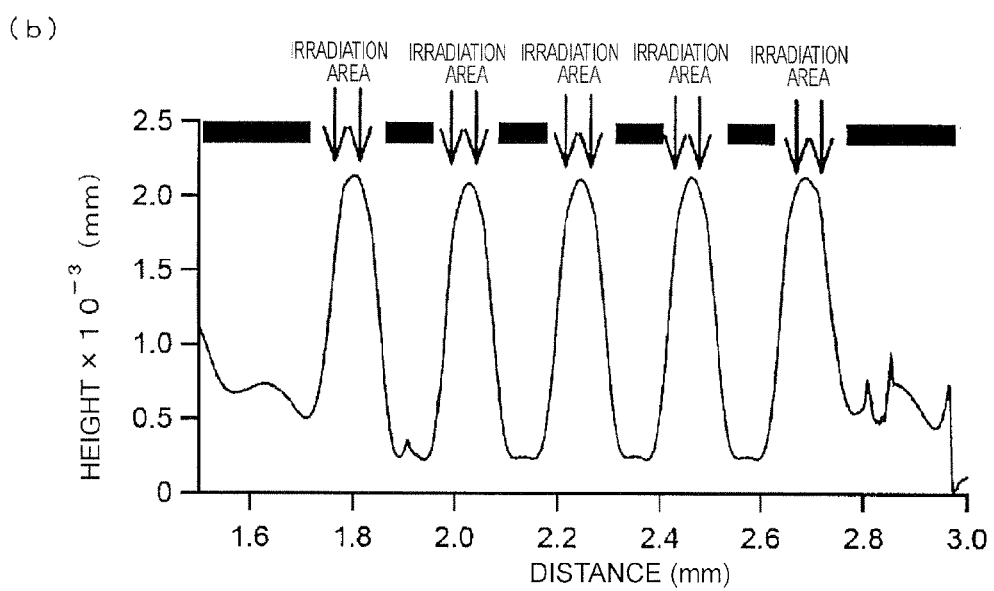
PHOTOMASK WITH 100 μm OF OPENING WIDTH, PEB DURATION 20 MIN.

[FIG. 3]
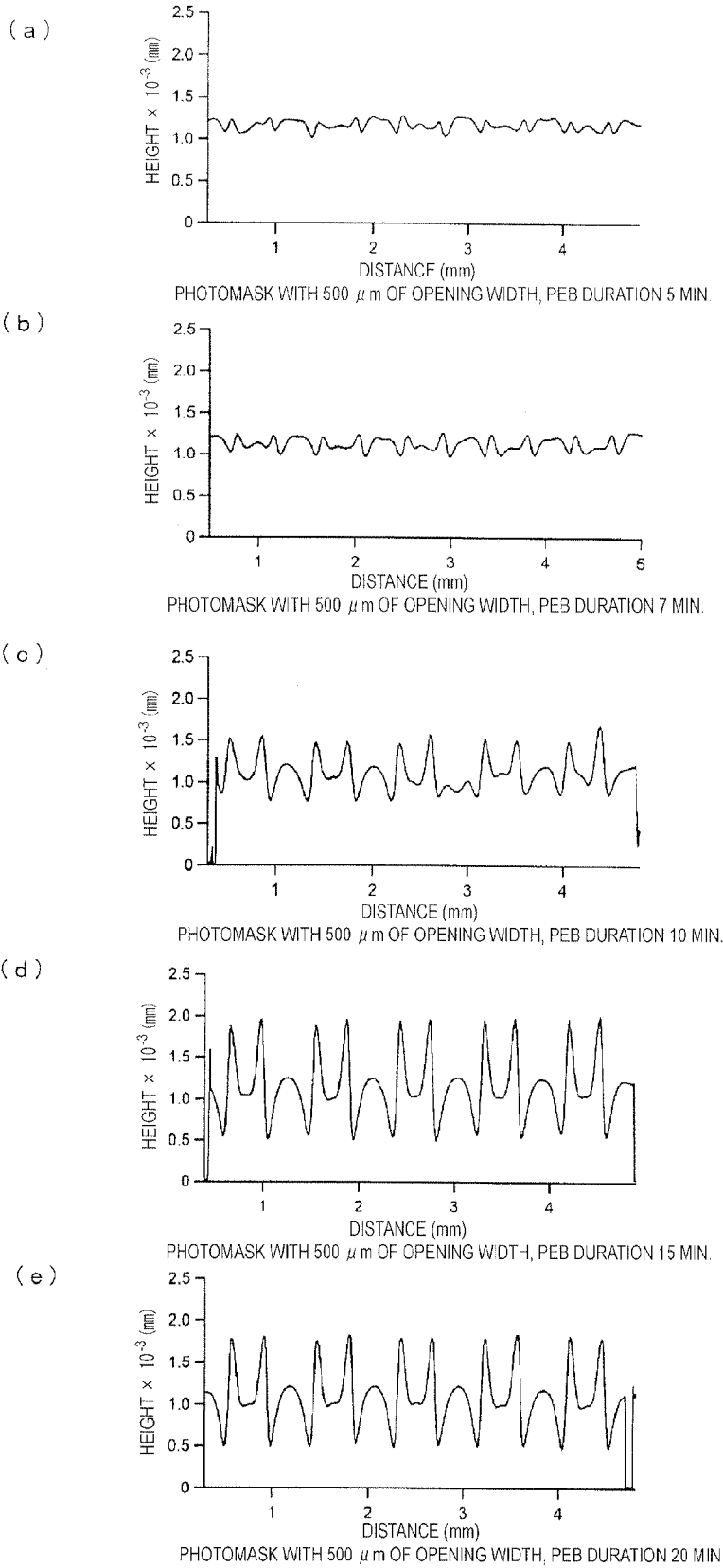

[FIG. 4]
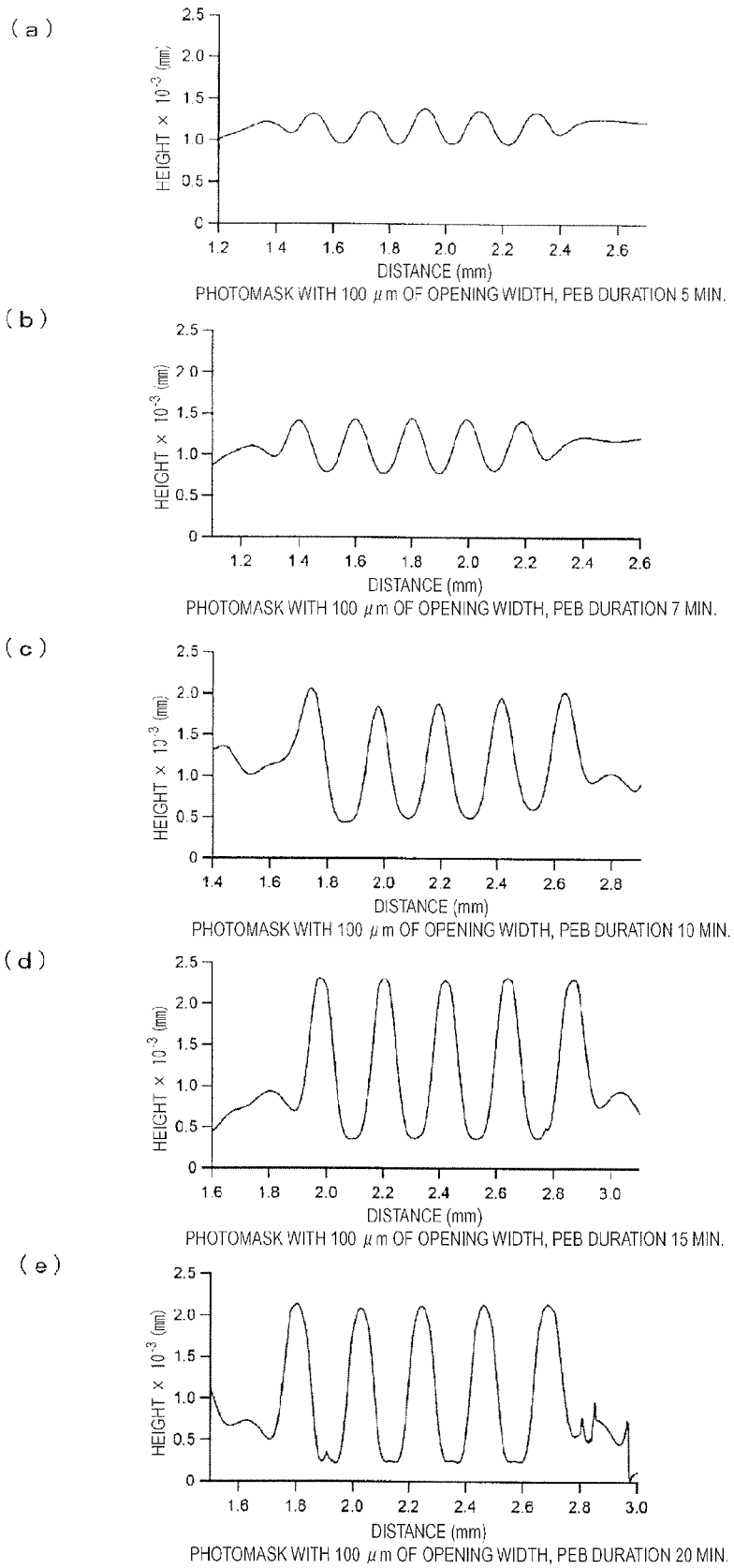

[FIG. 5]
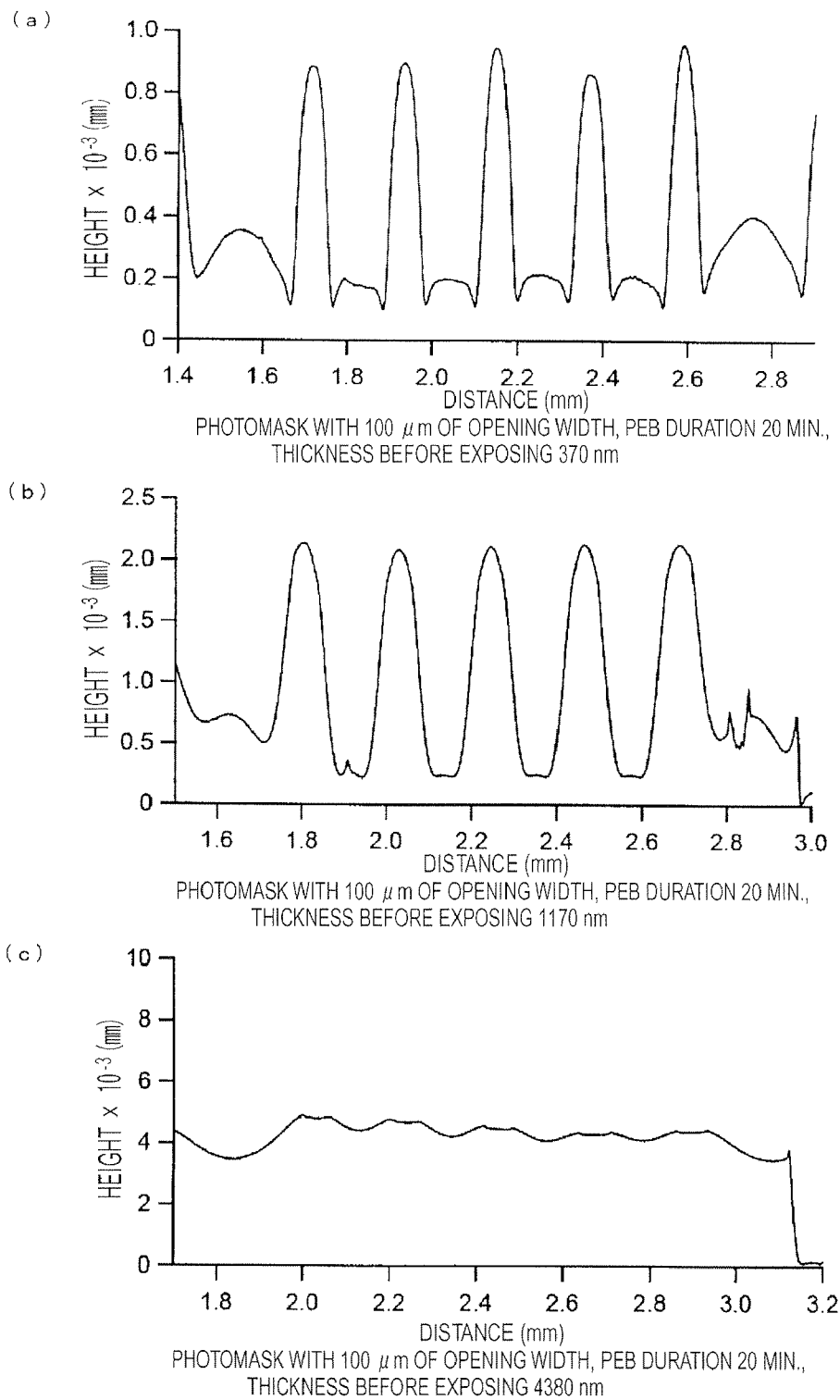

[FIG. 6]
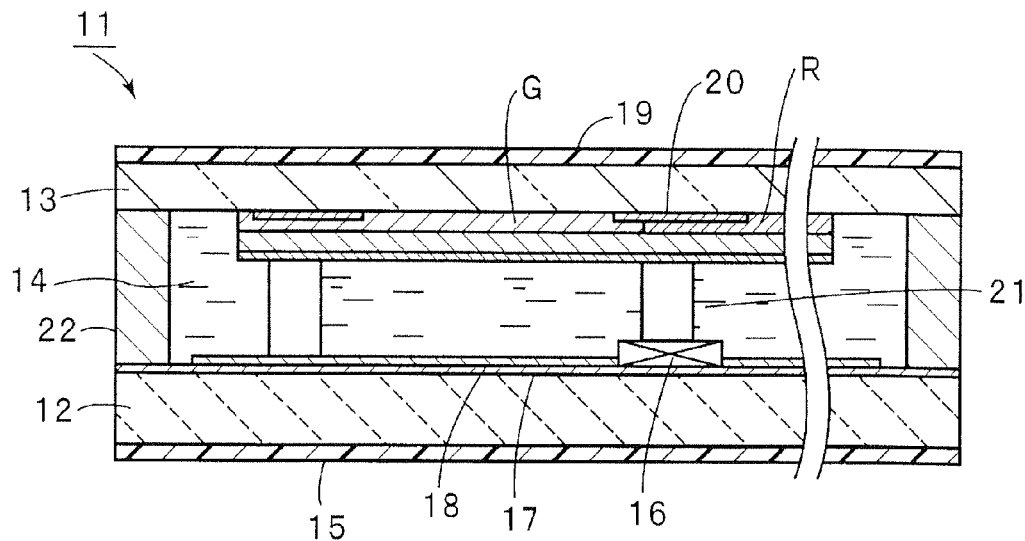
[FIG. 7]
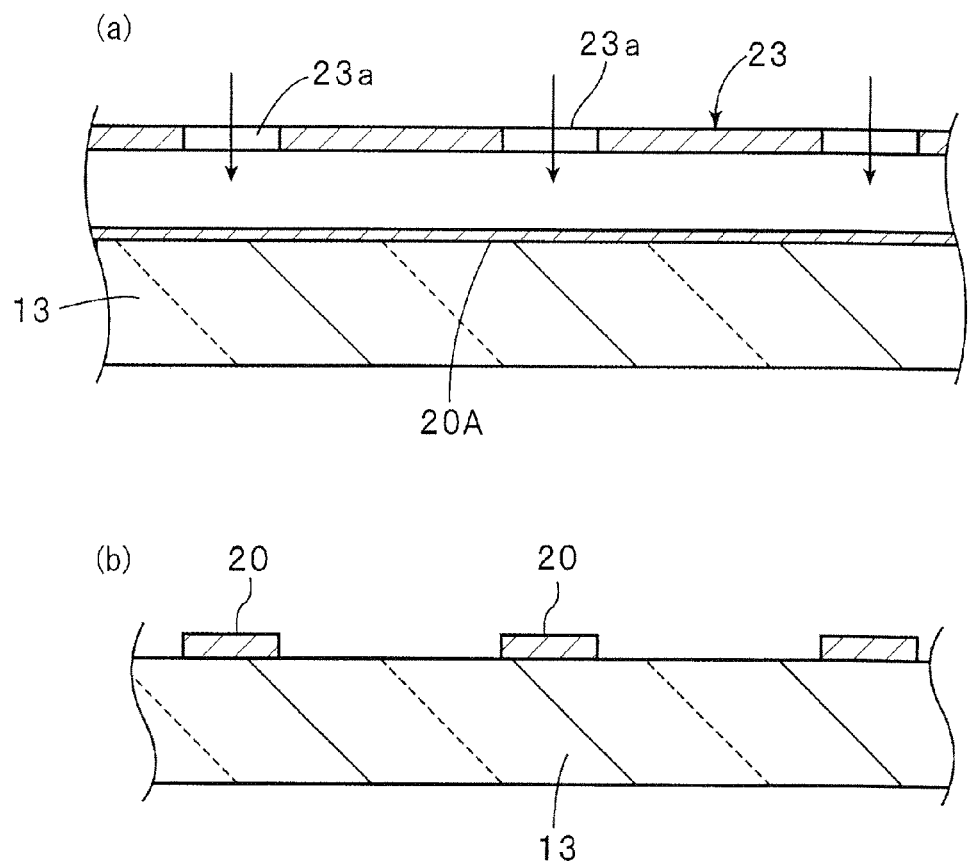

[FIG. 8]
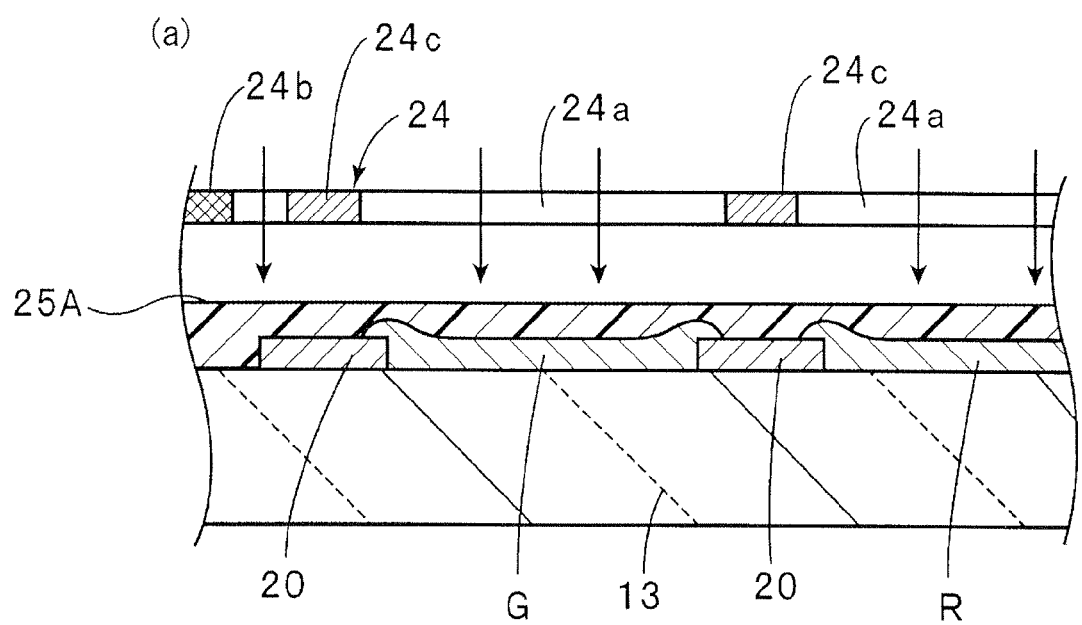
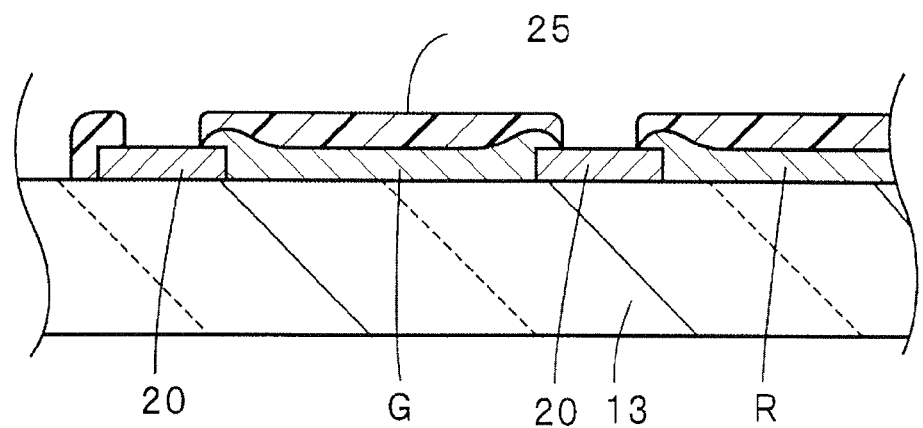

[FIG. 9]
(a)
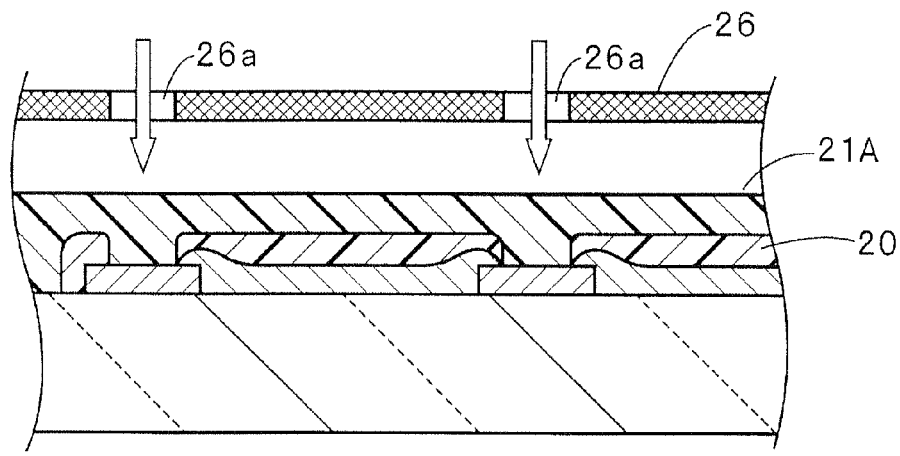
(b)
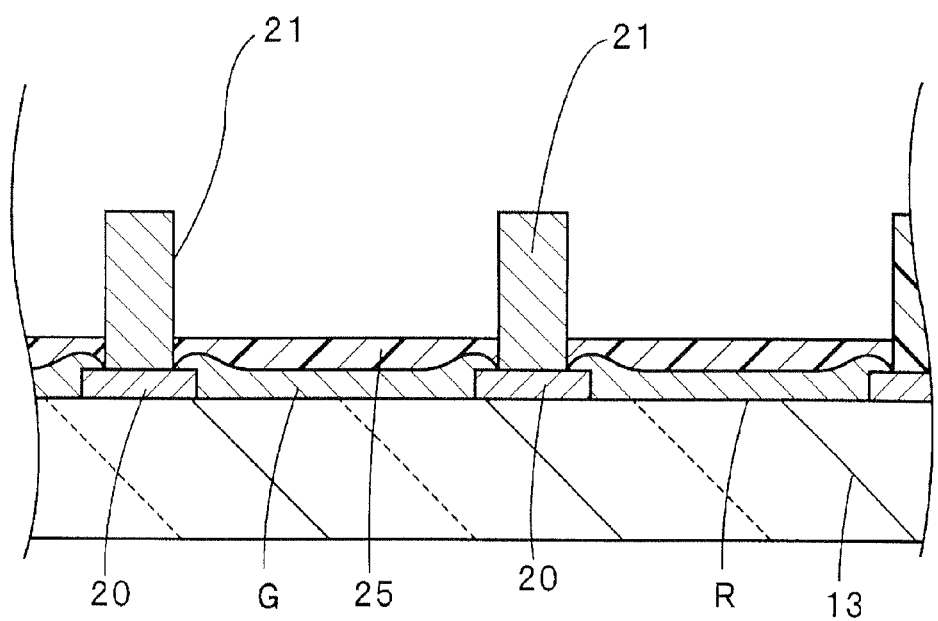

[FIG. 10]
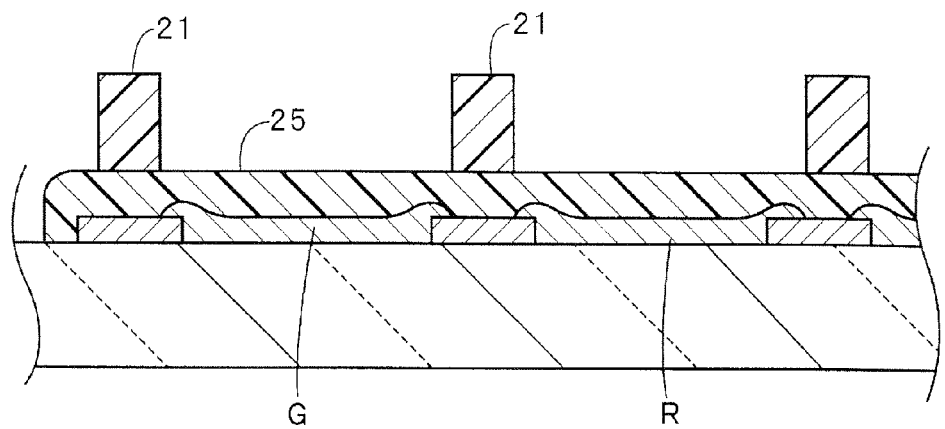
[FIG. 11]
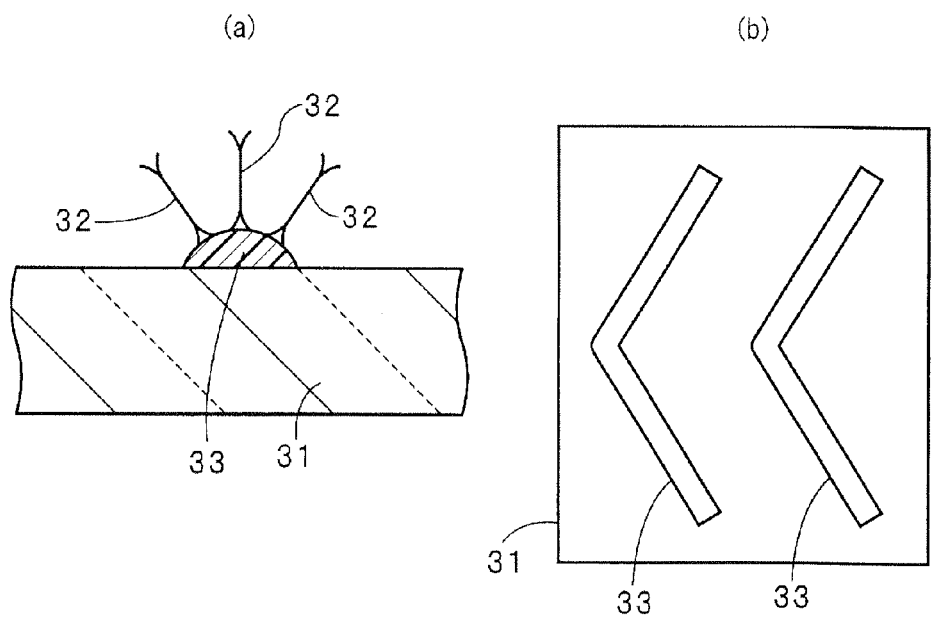

[FIG. 12]
(a)
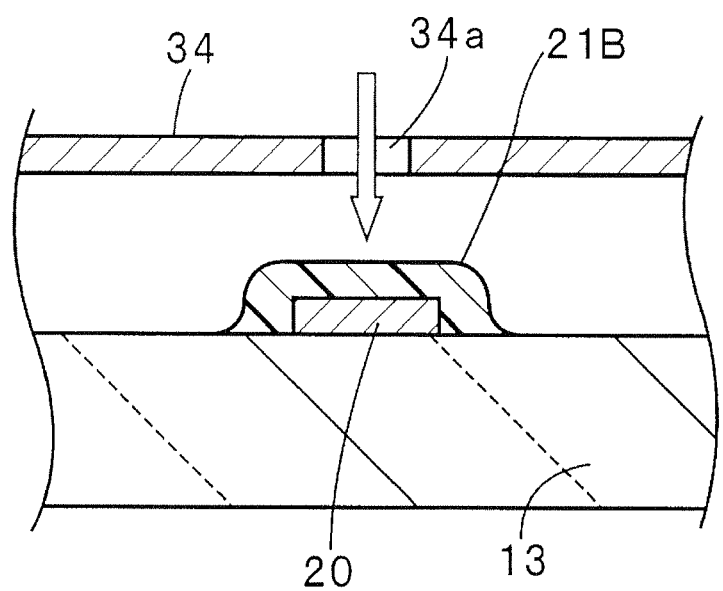
(b)
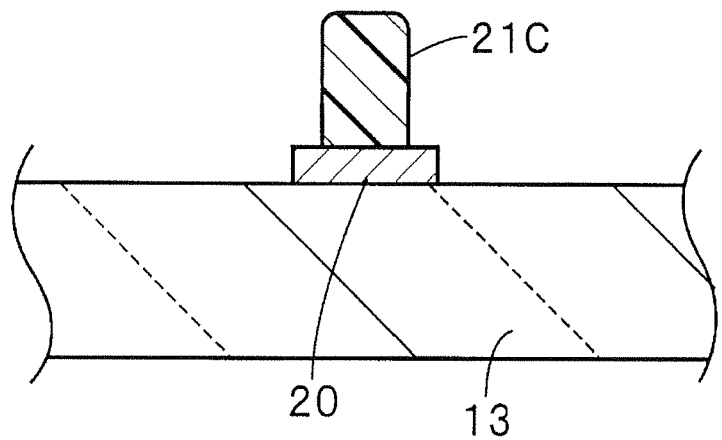

[FIG. 13]
(a)
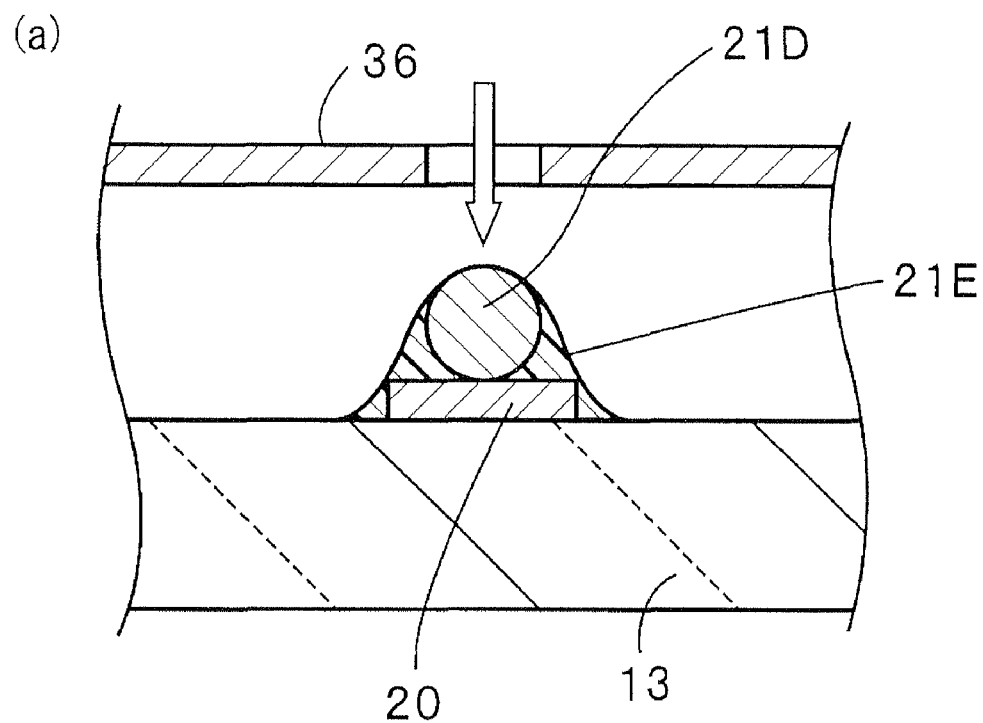
(b)
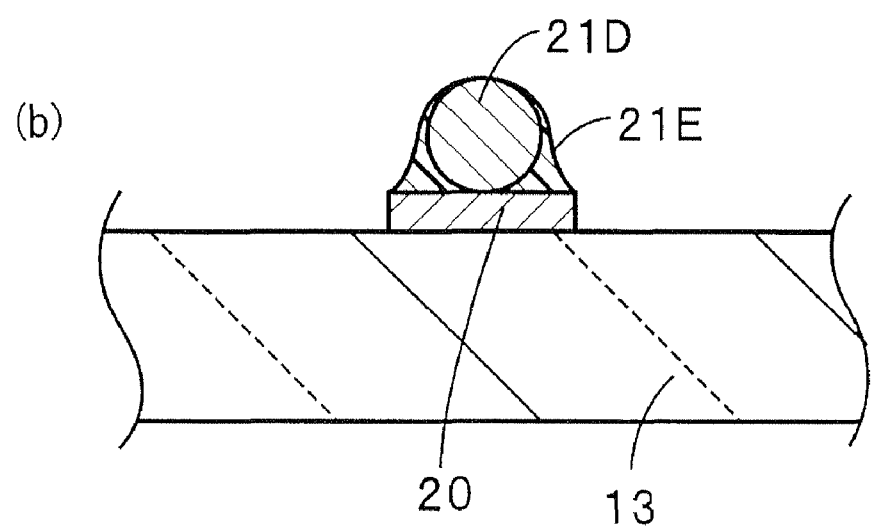

[FIG. 14]
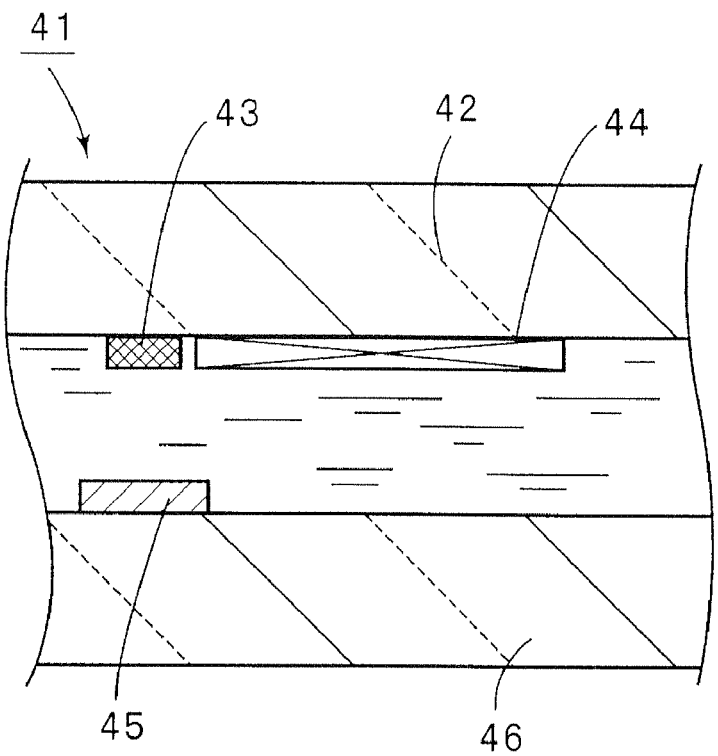
[FIG. 15]
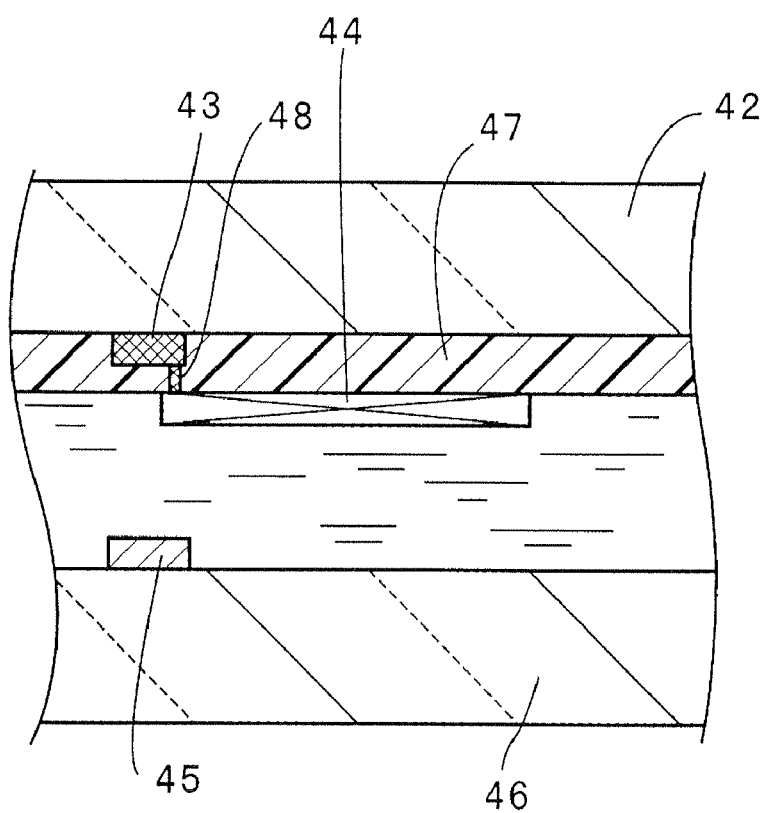

[FIG. 16]
(a)
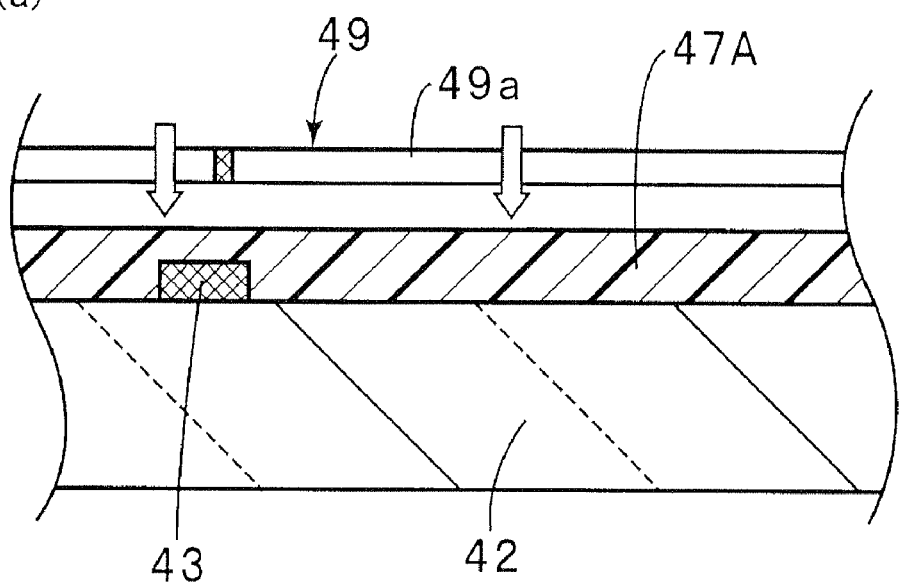
(b)
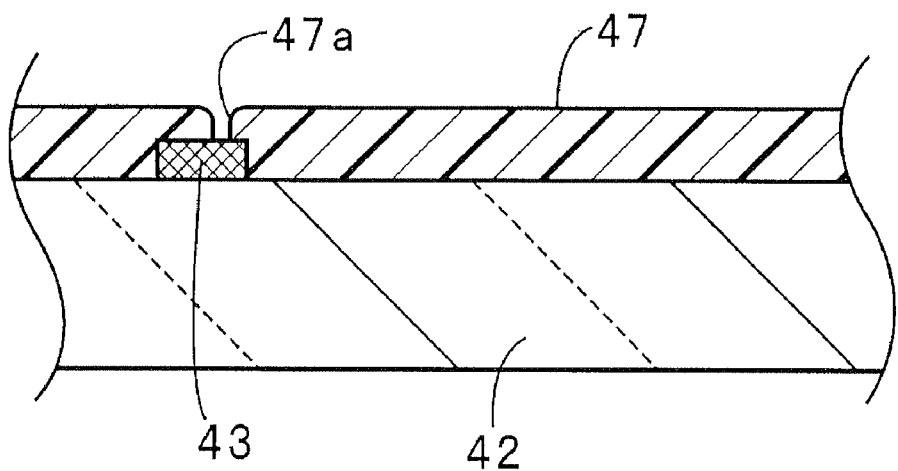

[FIG. 17]
(a)
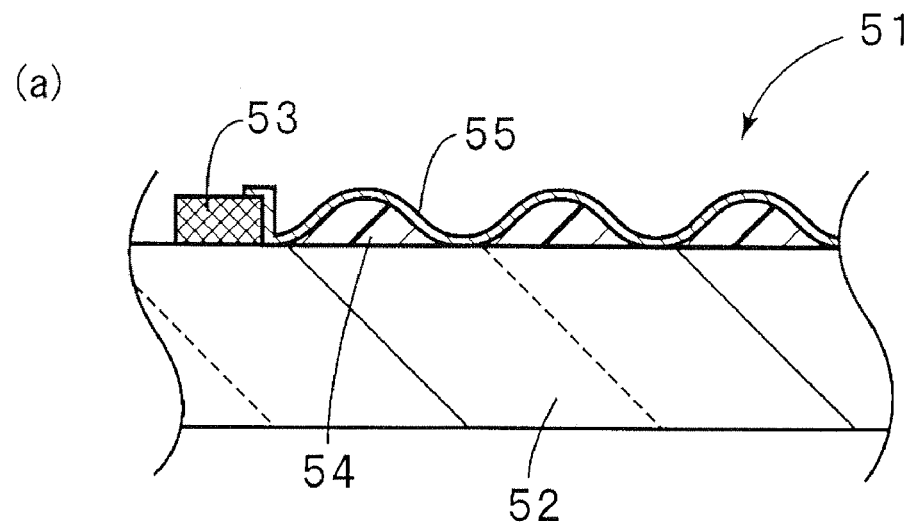
(b)
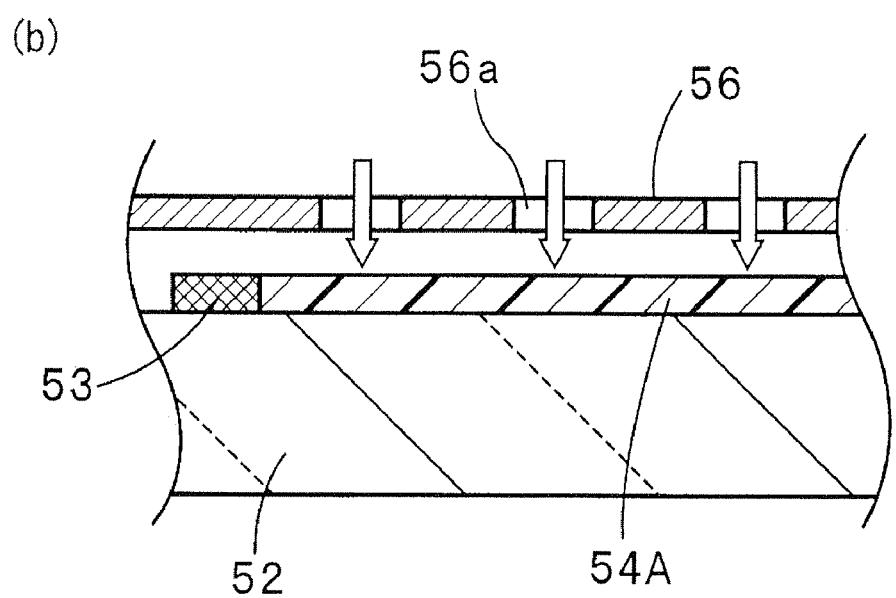

[FIG. 18]
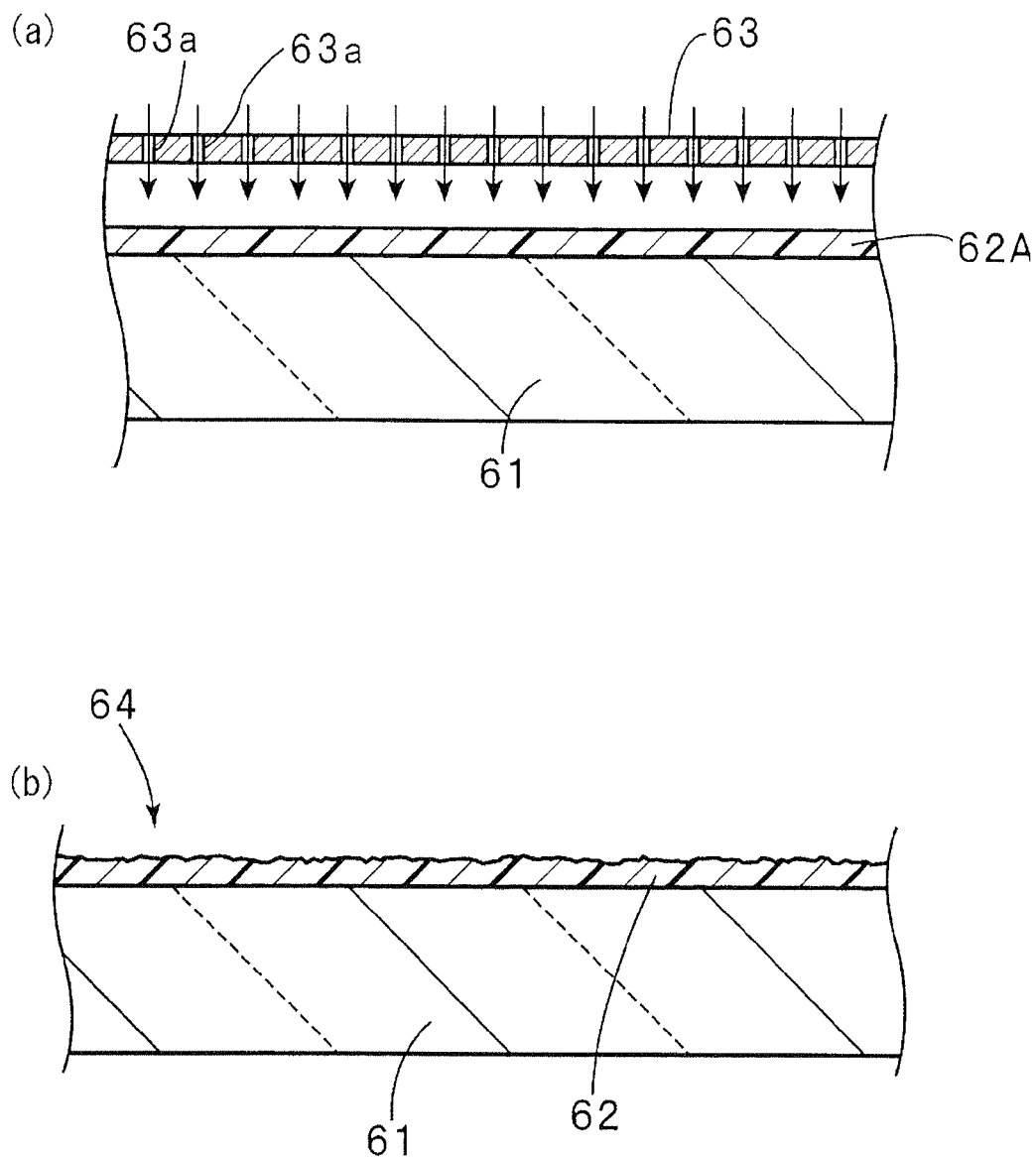

[FIG. 19]
(a) 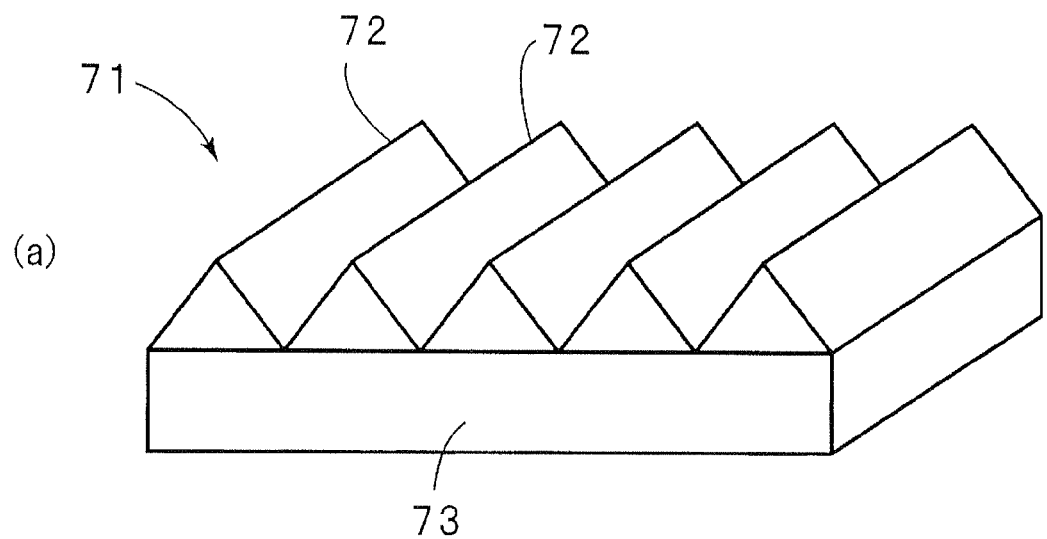
(b) 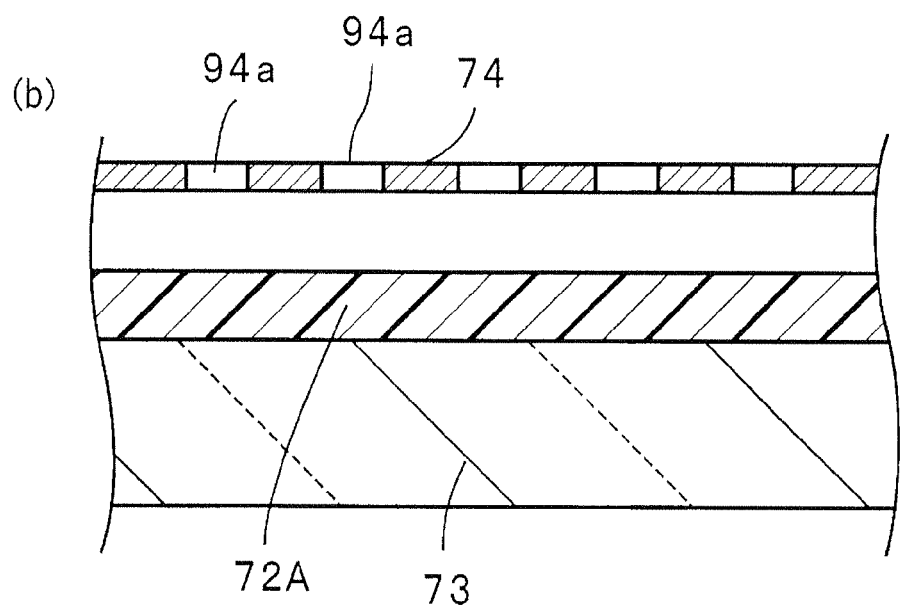

[FIG. 20]
(a)
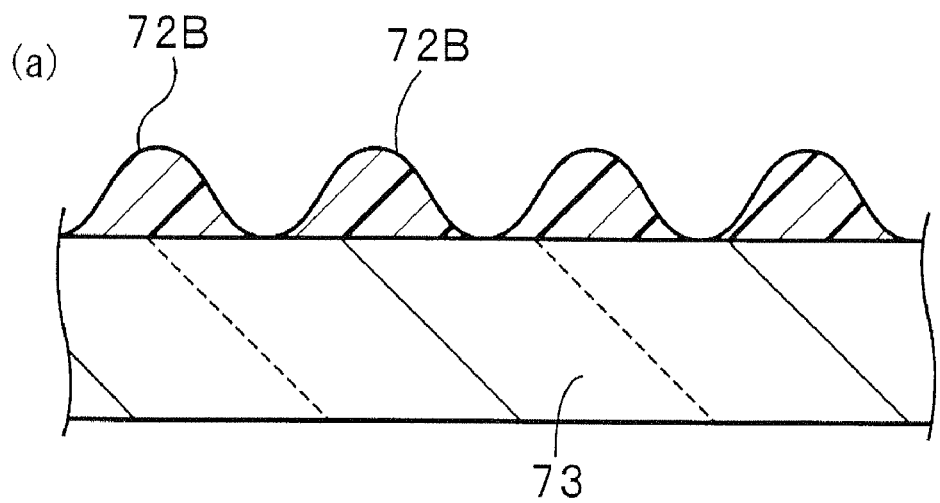
(b)
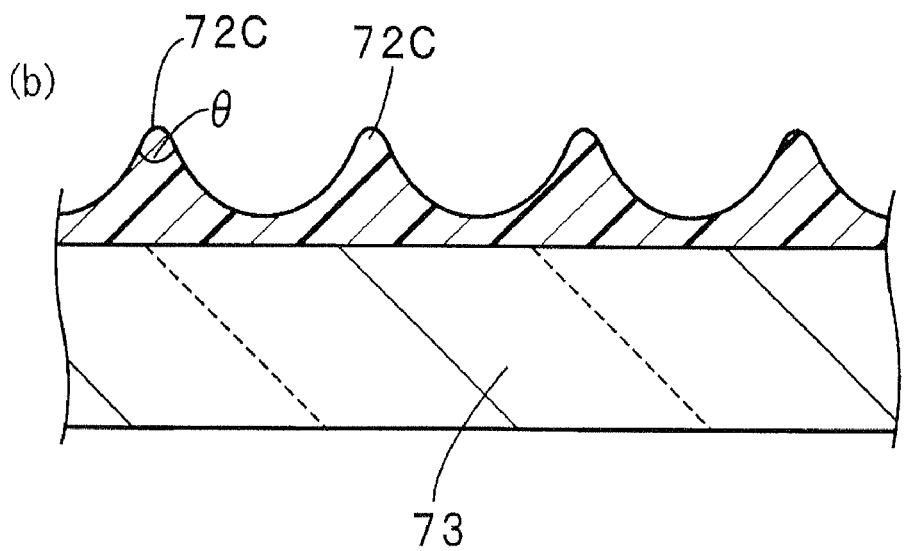

[FIG. 21]
(a) 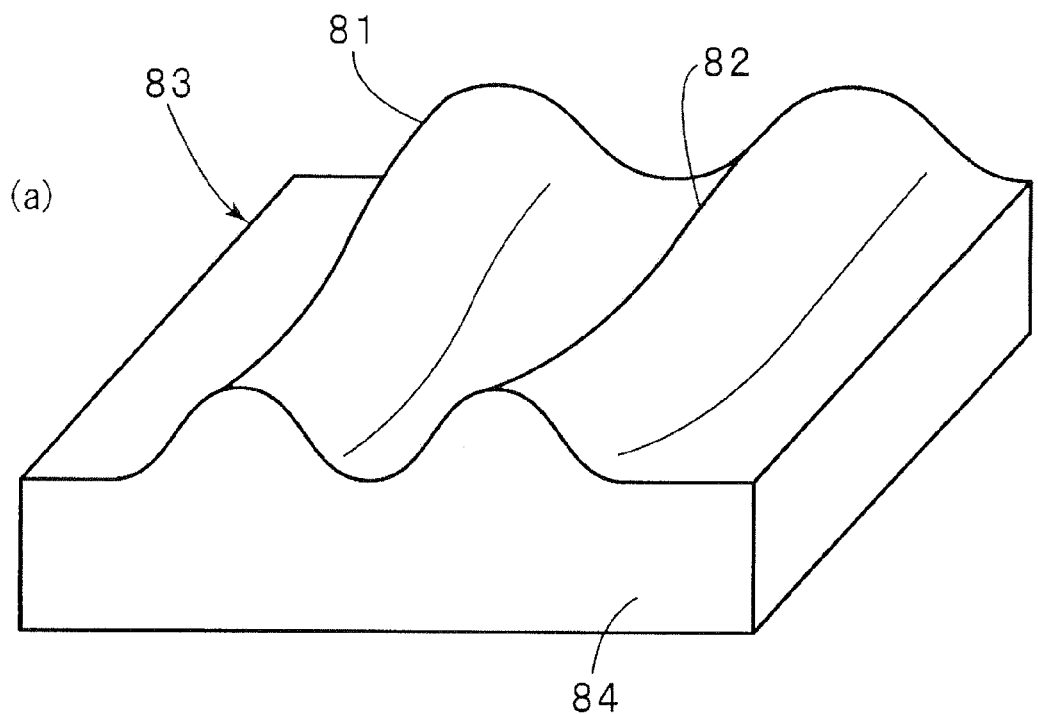
(b) 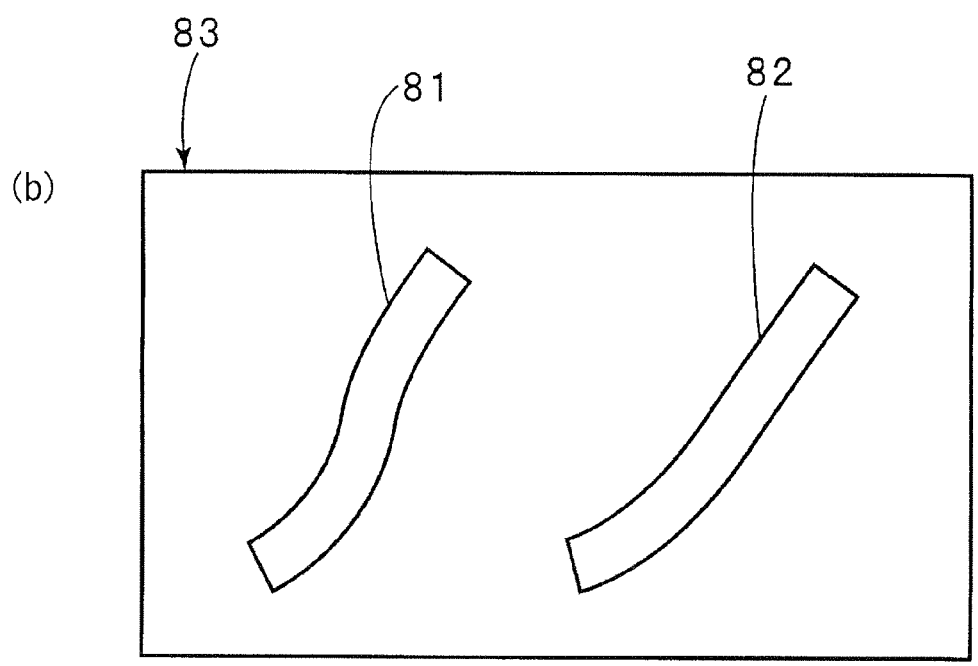

[FIG. 22]
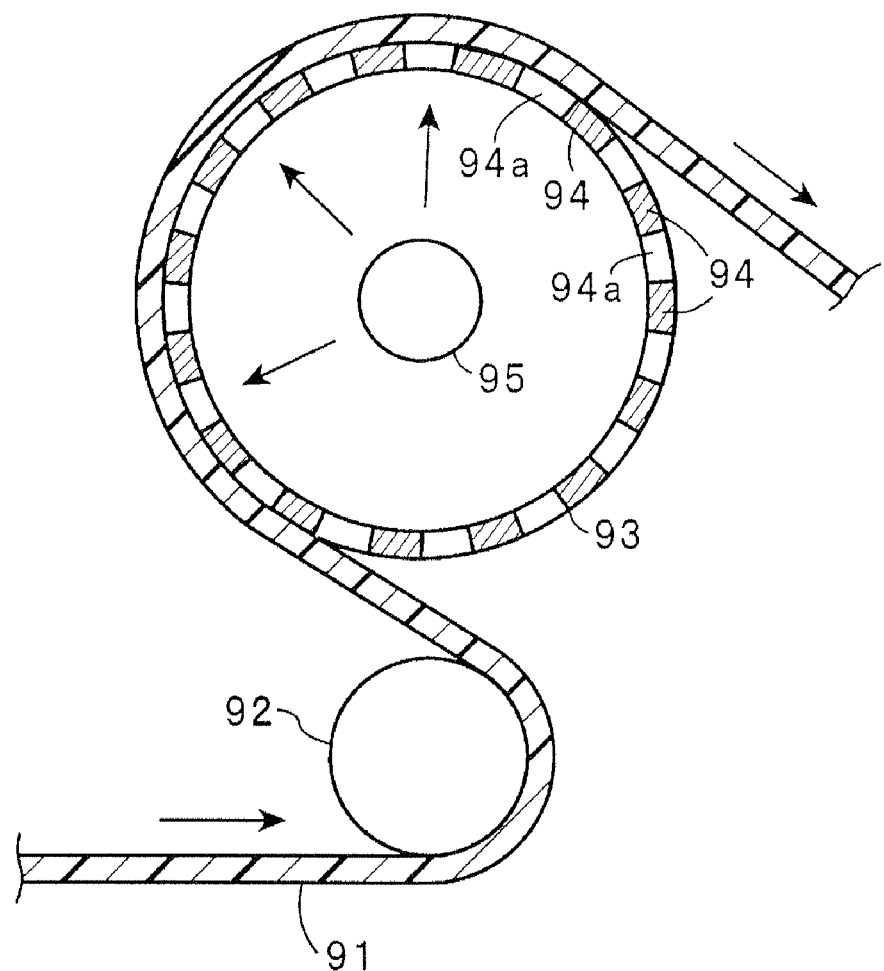

[FIG. 23]
(a)
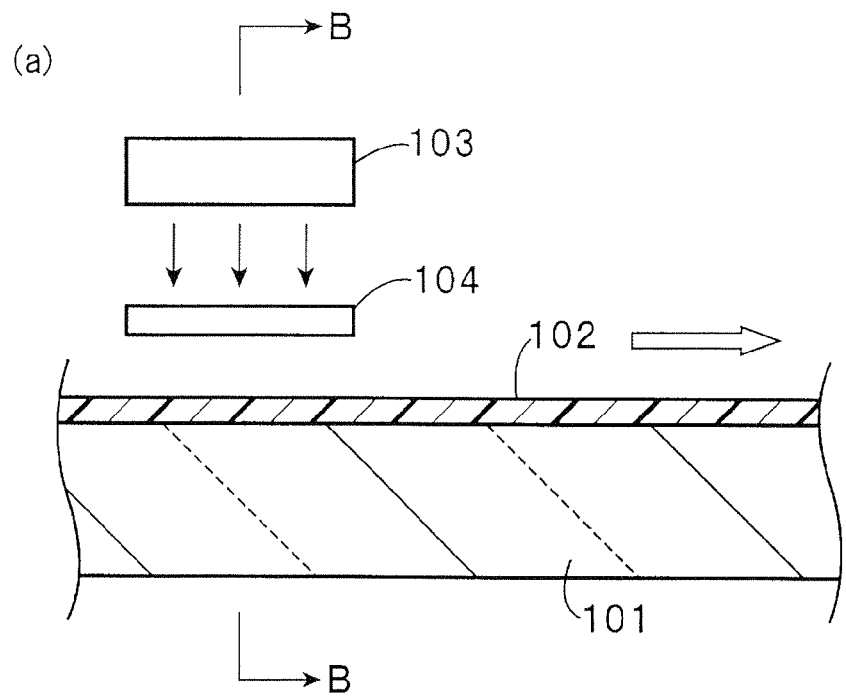
(b)
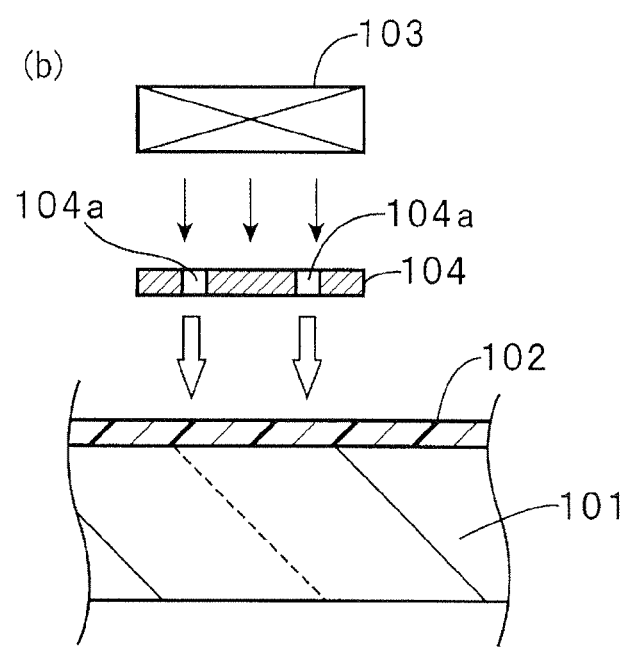

[FIG. 24]
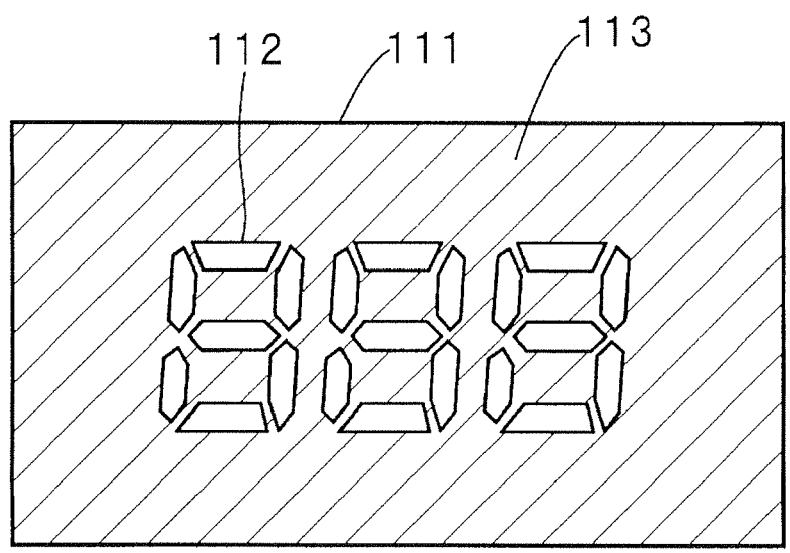

PROCESS FOR PRODUCING PATTERNED FILM AND PHOTOSENSITIVE RESIN COMPOSITION

TECHNICAL FIELD

The present invention relates to a process for producing a patterned film comprising a photosensitive resin composition having photosensitivity, in more detail it relates to a process for producing a patterned film, the process enabling obtaining of a patterned film having projected and depressed patterns formed on the surface thereof, for example, without development, after selective exposure of the photosensitive resin composition with light. It also relates a photosensitive resin composition to be used for the process for providing the patterned film.

BACKGROUND ART

Passivation films, gate insulating films, etc. are formed by minute pattern forming processes, in production of electronic devices, such as semiconductors. These films are formed using, for example, photosensitive resin compositions including condensates of alkoxy silanes, etc.

As an example of the pattern formation process, following patent document 1 discloses a process of forming patterns using a photosensitive resin composition that has an alkali soluble siloxane polymer, a compound for generating a reaction accelerator with light, and a solvent as principal components.

In the process described in the patent document 1, a photosensitive resin composition layer including the photosensitive resin composition was formed in formation of patterns, and then the photosensitive resin composition layer was exposed with light through a mask to progress a cross linking reaction of a condensate of an alkoxy silane in an exposed area, resulting in curing of the photosensitive resin composition layer in the exposed area. Furthermore, the photosensitive resin composition layer was developed after curing, and subsequently an uncured photosensitive resin composition layer in an unexposed area was removed to obtain the patterns.

Patent document 1: JP, 06-148895, A

DESCRIPTION OF THE INVENTION

However, The process described in the patent document 1 needed removal of the uncured photosensitive resin composition layer in the unexposed area by solvent development, in order to form the patterns. That is, the process described in the patent document 1 formed the patterns by performing development.

A large amount of developing solution was used for such a development, and the developing solution was to be processed as a waste fluid, leading to large environmental load. Furthermore, the development needed time and effort and also further needed drying process after development. Therefore, implementation of the development process needed much time for the pattern formation, and simultaneously needed preparation of extraordinary development facilities.

Furthermore, when development is performed, the uncured photosensitive resin composition layer in the unexposed area is to be removed. In order to form such a photosensitive resin composition layer, a redundant design of photosensitive resin composition was needed.

In consideration of the present circumstances of the above-described conventional technologies, the present invention aims at providing a process for producing a patterned film having projected and depressed patterns formed on the surface thereof, the process forming a photosensitive resin composition layer on a substrate, and after selective exposure of the photosensitive resin composition layer with light through a mask, the process, for example, eliminating removal of the photosensitive resin composition layer in an unexposed area or an exposed area by development. The present invention also aims at providing the photosensitive resin composition to be used for the process for producing the patterned film.

The process for producing the patterned film of the present invention comprises:
a step of preparing a photosensitive resin composition to be cured by generating an acid or a base by irradiation of light;
a step of forming a photosensitive resin composition layer having a predetermined thickness by applying the photosensitive resin composition on a substrate; and
a step of obtaining a patterned film having projected and depressed patterns formed on the surface thereof, wherein, by selective exposure of the photosensitive resin composition layer with light through a mask, at least a part of the photosensitive resin composition in an unexposed area is shifted to an exposed area, and then the photosensitive resin composition is cured.

In a specific aspect of the process for producing the patterned film of the present invention, the photosensitive resin composition layer is heat-treated after selective exposure of the photosensitive resin composition layer with light through the mask, in the step of obtaining the patterned film.

In an other specific aspect of the process for producing the patterned film of the present invention, at least a part of the photosensitive resin composition layer projects in the exposed area, and at least a part of the photosensitive resin composition layer depresses in the unexposed area to form the projected and depressed patterns on the surface thereof, in the step of obtaining the patterned film.

The present invention is a photosensitive resin composition used for the inventive process for producing the patterned film, the photosensitive resin composition comprising:
a curing resin to be cured by an action of an acid or a base; and
a photoacid or a photobase generator for generating the acid or the base by irradiation of light.

A specific aspect of the photosensitive resin composition of the present invention further comprises an acid or a base proliferating agent for proliferatingly generating an acid or a base by an action of the acid or the base.

In an other specific aspect of the photosensitive resin composition of the present invention, the curing resin is a novolak epoxy oligomer.

In an other aspect of the photosensitive resin composition of the present invention, the photoacid or photobase generator is a photobase generator represented with a following formula (1).

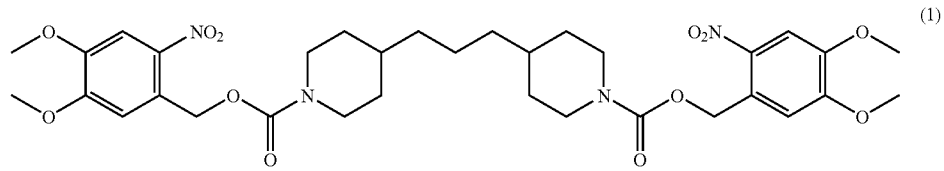

In still another aspect of the photosensitive resin composition of the present invention, the acid or base proliferating agent is a base proliferating agent represented with a following formula (2).

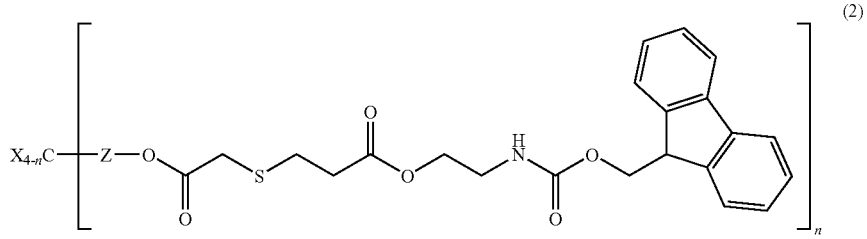

In the above-described formula (2), X represents a hydrogen atom, a substituted alkyl group or an unsubstituted alkyl group, Z represents a substituted or an unsubstituted alkylene group, and n represents an integer of 1 to 4.

EFFECT OF THE INVENTION

The process for producing the patterned film of the present invention comprises a process for obtaining a patterned film having projected and depressed patterns formed on the surface thereof, wherein, by selective exposure of the photosensitive resin composition layer with light through a mask, at least a part of the photosensitive resin composition in an unexposed area is shifted to an exposed area, and then the photosensitive resin composition is cured, and therefore a patterned film having projection and depression formed on the surface of the photosensitive resin composition layer will be obtained.

Therefore, a patterned film having projected and depressed patterns formed on the surface thereof may be obtained, for example, without development. Accordingly, the present invention can eliminate use of a large amount of developing solution, leading to reduction of environmental load. Furthermore, the present invention eliminates the necessity of developing process, and the necessity for drying process to be performed after development, enabling efficient producing of the patterned film. Furthermore, the present invention also eliminates preparation of extraordinary development facilities.

Furthermore, in the above-described patent document 1, the photosensitive resin composition layer in the unexposed area was removed in the pattern formation process. On the other hand, since the process for producing the patterned film of the present invention does not need removal of the photosensitive resin composition layer by development, it can eliminate the necessity of use of an additional photosensitive resin composition for forming such a photosensitive resin composition layer to be removed. Therefore, the present invention can reduce the amount of the photosensitive resin composition to be used, and thereby it can suppress the producing cost of the patterned film. In addition, since the present invention can eliminate the necessity for removal of the photosensitive resin composition layer by development, it can reduce environmental load.

In the step of obtaining the patterned film, when the photosensitive resin composition layer is heat-treated after selective exposure of the photosensitive resin composition layer with light through the mask, at least a part of the photosensitive resin composition in the unexposed area efficiently shifts to the exposed area and then is cured by exposure and heat-treatment, and thereby a patterned film having outstanding pattern shape can be obtained.

In the step of obtaining the patterned film, when at least a part of the photosensitive resin composition layer projects in the exposed area, and at least a part of the photosensitive resin composition layer depresses in the unexposed area to form a projected and depressed pattern on the surface, a patterned film having outstanding pattern shape can be obtained.

Since the photosensitive resin composition of the present invention comprises a curing resin to be cured by an action of an acid or a base, and a photoacid or a photobase generator to generate the acid or the base by irradiation of light, a patterned film having projected and depressed patterns formed on the surface thereof can be obtained, for example, without development.

When an acid or a base proliferating agent for proliferatingly generating an acid or a base by an action of the acid or the base is further comprised, the acid or the base can be efficiently generated.

When the curing resin is a novolak epoxy oligomer, at least a part of the photosensitive resin composition in the unexposed area more efficiently shifts to the exposed area, upon selective exposure of the photosensitive resin composition by light.

When the photoacid or the photobase generator is the photobase generator represented with the above-described formula (1), at least a part of the photosensitive resin composition in the unexposed area more efficiently shifts to the exposed area, upon selective exposure of the photosensitive resin composition by the light.

When the acid or base proliferating agent is the base proliferating agent represented with the above-described formula (2), at least a part of the photosensitive resin composition in the unexposed area more efficiently shifts to the exposed area, upon selective exposure of the photosensitive resin composition by light.

BRIEF DESCRIPTION OF THE DRAWINGS

FIGS. 1 (a) to (d) are views for describing the process for producing the patterned film concerning one embodiment of the present invention, (a) to (c) are front sectional views stepwisely representing the condition of forming the patterned film on the substrate, and (d) is a plan view representing the substrate having the formed patterned film illustrated in (c);

FIG. 2 (a) is a view representing a height profile of a patterned film obtained using a photomask with 500 µm of opening width, and (b) is a view representing a height profile of a patterned film obtained using a photomask with 100 µm of opening width;

FIGS. 3 (a) to (e) are views representing height profiles of patterned films obtained by exposure using a photomask with 500 μm of an opening width, and then by PEB treatment for 5 minutes, 7 minutes, 10 minutes, 15 minutes, or 20 minutes, respectively;

FIGS. 4 (a) to (e) are views representing height profiles of patterned films obtained by exposing using a photomask with 100 μm of an opening width, and then by PEB treatment for 5 minutes, 7 minutes, 10 minutes, 15 minutes, or 20 minutes, respectively;

FIGS. 5 (a) to (c) are views representing height profiles of patterned films obtained by exposing photosensitive resin composition layers having a thickness of 370 nm, 1170 nm, or 4380 nm, respectively, using a photomask with 500 μm of an opening width;

FIG. 6 is a schematic partial cross-sectional front sectional view for describing a liquid crystal display element using the process for producing the patterned film of the present invention;

FIGS. 7 (a) and (b) are respective partial cross-sectional front sectional views representing an example of a process of forming a black matrix in a liquid crystal display element in accordance with the process for producing the patterned film of the present invention;

FIGS. 8 (a) and (b) are respective partial cross-sectional front sectional views representing an example of a process of forming an overcoat layer in a liquid crystal display element in accordance with the process for producing the patterned film of the present invention;

FIGS. 9 (a) and (b) are respective partial cross-sectional front sectional views for describing an example of a process of forming a spacer of a liquid crystal display element in accordance with the process for producing the patterned film of the present invention;

FIG. 10 is a schematic front sectional view for describing a structure where a spacer is formed on an overcoat layer;

FIGS. 11 (a) and (b) are a schematic front sectional view, and a schematic plan view for describing a planar shape of a projected part, in a liquid crystal display element having molecule chains of the liquid crystal disposed in oblique directions with respect to a glass substrate, the views describing the projected part for making the liquid crystal molecules mutually facing in the oblique directions;

FIGS. 12 (a) and (b) are respective partial cross-sectional front sectional views for describing an example of a process of forming a spacer by an ink-jet method on a black matrix;

FIGS. 13 (a) and (b) are respective partial cross-sectional front sectional views for describing an example of a process of forming a spacer according to the present invention using a dispersion liquid containing a spacer particle;

FIG. 14 is a schematic front sectional view illustrating a liquid crystal display element having a pixel disposed in a side of a TFT;

FIG. 15 is a partial cross-sectional front sectional view of a liquid crystal display element having an insulating resin layer formed therein;

FIGS. 16 (a) and (b) are respective partial cross-sectional front sectional views for describing a process of forming an insulating resin layer represented in FIG. 15;

FIGS. 17 (a) and (b) are respective partial cross-sectional front sectional views for representing a reflecting plate to be formed, and a process of producing the reflecting plate by an example of the process for producing the patterned film using the photosensitive resin composition of the present invention;

FIGS. 18 (a) and (b) are respective partial cross-sectional front sectional views illustrating an example of a process for producing a diffusing plate in accordance with the process for producing the patterned film of the present invention;

FIGS. 19 (a) and (b) are a perspective view illustrating an example of a prism lens sheet formed in accordance with the process for producing the patterned film of the present invention and a schematic front sectional views illustrating a process of producing the prism lens sheet;

FIGS. 20 (a) and (b) are respective partial cross-sectional front sectional views for describing a modified example of a projected part;

FIGS. 21 (a) and (b) are a perspective view and a plan view representing an example of a shape of antireflection film having non-periodicity;

FIG. 22 is a schematic front sectional view for describing an example of a process for producing a patterned film on a long-shaped film in accordance with the present invention;

FIGS. 23 (a) and (b) are a side face sectional view for describing an other example for producing a patterned film on a long-shaped film in accordance with the process for producing the patterned film of the present invention and a sectional view along with B-B line in (a); and FIG. 24 is a schematic plan view for describing a segment type display as an example of a passive type liquid crystal display element having a light-shielded area formed in accordance with the process for producing the patterned film of the present invention.

DESCRIPTION OF NOTATIONS

1 Photosensitive resin composition layer
1A Patterned film
2 Substrate
3 Mask
11 Liquid crystal display element
12, 13 Glass substrate
14 Liquid crystal
15 Polarizing plate
16 TFT
17 Orientation film
18 Picture element electrode
19 Polarizing plate
20 Black matrix
21 Spacer
21A Photosensitive resin composition layer
21B Dispersion liquid
21C Spacer
21D Spacer particle
22 Sealant
23 Mask
23a Opening
24 Mask
24a Opening
25A Photosensitive resin composition layer
25 Overcoat layer
26 Mask
26a Opening
31 Glass substrate
32 Liquid crystal molecule
33 Projected part
34 Mask
34a Opening
35 Photosensitive resin composition
36 Mask
41 Liquid crystal display element
42 Glass substrate
43 TFT
44 Pixel
45 Black matrix
46 Glass substrate 47 Insulating resin layer
47A Photosensitive resin composition layer
47a Through-hole
48 Via-hole electrode
49 Mask
49a Opening
51 Reflecting plate
52 Glass substrate
53 TFT
54 Insulating resin layer
55 ITO electrode
55A Photosensitive resin composition layer
56 Mask
56a Opening
61 Glass plate
62 Resin composition layer
62A Photosensitive resin composition layer
63 Mask
63a Through-hole
64 Diffusing plate
71 Prism lens sheet
72 Prism lenses part
72A Photosensitive resin composition layer
72B, 72C Projected part
73 Glass plate
74 Mask
74a Opening
81, 82 Projected part
83 Antireflection board
84 Glass plate
91 Film
92 Roll
93 Exposure roll
94 Mask
95 Light source
101 Film
102 Photosensitive resin composition layer
103 Light source
104 Mask
104a Opening
111 Segment type liquid crystal display element
112 Segment
113 Light shielded area
R Red color filter
G Green color filter

BEST MODE FOR CARRYING OUT THE INVENTION

Details of the present invention will be described hereinafter.

As result of wholehearted investigation performed by the present inventors in order to solve aforementioned problems regarding the process for producing the patterned film that can provide patterned films without development, it has been found out that a patterned film having projected and depressed patterns formed on the surface thereof may be obtained, when at least a part of the photosensitive resin composition in an unexposed area shifts to an exposed area upon selective exposure of a photosensitive resin composition layer with light through a mask and then is cured, leading to completion of the present invention.

The process for producing the patterned film of the present invention comprises:
a step of preparing a photosensitive resin composition to be cured by generating an acid or a base by irradiation of light;
a step of forming a photosensitive resin composition layer having a predetermined thickness by applying the photosensitive resin composition on a substrate; and
a step of obtaining a patterned film having projected and depressed patterns formed on the surface thereof, wherein, by selective exposure of the photosensitive resin composition layer with light through a mask, at least a part of the photosensitive resin composition in an unexposed area is shifted to an exposed area, and then the photosensitive resin composition is cured.

FIGS. 1 (a) to (c) are front sectional views for describing the process for producing the patterned film concerning one embodiment of the present invention. FIG. 1 (a) is a view illustrating a condition immediately after application of a photosensitive resin composition on a substrate, and FIG. 1 (b) is a view illustrating a condition of selective exposure of the photosensitive resin composition layer with light through a mask. FIG. 1 (c) is a front sectional view illustrating the substrate having a formed patterned film, and FIG. 1 (d) is a plan view illustrating the substrate illustrated in FIG. 1 (c).

As illustrated in FIG. 1 (a), first, the photosensitive resin composition that generates an acid or a base by irradiation of light, and that is subsequently cured is prepared. Subsequently, the photosensitive resin composition is applied on a substrate 2 to form the photosensitive resin composition layer 1 having a predetermined thickness.

Detailed process in formation of the photosensitive resin composition layer 1 having a predetermined thickness on the above-described substrate 2 is not in particular limited, and general coating methods may be used. For example, immersion coating, roll coating, bar coating, brush coating, spray coating, spin coating, extrusion coating, gravure coating, slit coating, curtain coating, stamping, screen printing, offset printing, ink-jet method etc. may be used. As the substrate on which the photosensitive resin composition is to be coated, a silicon substrate, a glass substrate, a metal plate, a plastics board, etc. may be used in accordance with application. The thickness of the photosensitive resin composition layer may vary with applications, and is approximately 10 nm to 10 μm.

In case of using a solvent for dissolution of the resin component, the photosensitive resin composition layer coated on the substrate is preferably heat-treated for drying of the solvent. Heat-treatment temperature is generally 40° C. to 200° C., and is suitably selected according to the boiling point and the vapor pressure of the solvent to be used.

Next, as illustrated in FIG. 1 (b), the photosensitive resin composition layer 1 having the predetermined thickness is covered with a mask 3, and subsequently it is irradiated with light to give a pattern shape. Usual masks available in the market may be used as the mask 3. In an exposed area of the photosensitive resin composition layer 1 irradiated with the light to give the pattern shape, curing of the photosensitive resin composition advances by the effect of the acid or the base generated by exposure.

The light source for irradiation of the light, such as ultraviolet rays and visible rays, is not in particular limited, ultra high-pressure mercury lamps, deep UV lamps, high pressure mercury lamps, low pressure mercury lamps, halide lamps, LED light sources, laser beam, excimer laser, etc. may be used. These light sources are suitably selected according to the sensitization wavelengths of the components, for example, the photoacid or the photobase generator or the sensitizer, included in the photosensitive resin composition.

The irradiation energy of the light is determined based also on the desired thicknesses and the components included in the above-described photosensitive resin composition, for example, the type of the photoacid or the photobase generator or the sensitizer, and it is generally in the range of 10 to 1000 mJ/cm$^2$. The irradiation energy less than 10 mJ/cm$^2$ does not allow sufficient curing of the photosensitive resin composition. Furthermore, the irradiation energy more than 1000 mJ/cm$^2$ may possibly lengthen the exposure duration, leading to potential reduction of producing efficiency of the thin patterned film.

In this example, the photosensitive resin composition layer is heat-treated after exposure. Heat-treatment of the photosensitive resin composition layer can efficiently shift at least a part of the photosensitive resin composition in an unexposed area to an exposed area, and further can efficiently progress curing of the photosensitive resin composition layer. The conditions of the above-described heat-treatment may suitably be set based on the components included in the photosensitive resin composition, and is not in particular limited. The heat-treatment is preferably performed in the range of 60 to 200° C. and for 5 to 30 minutes.

Furthermore, if needed, after exposure and heat-treatment of the photosensitive resin layer, the whole photosensitive resin layer may be irradiated with light. This irradiation can provide uniform curing condition of the photosensitive resin layer.

In the process for producing the patterned film concerning this example, selective exposure by the light through the mask and heat-treatment of the photosensitive resin composition layer shift at least a part of the photosensitive resin composition in the unexposed area to the exposed area, as illustrated by the arrow head and the notation X in FIG. 1 (c). The photosensitive resin composition layer 1 is gradually cured accompanied by shift of the photosensitive resin composition. After curing of the photosensitive resin composition layer 1, the shift of the photosensitive resin composition also stops, and a patterned film 1A illustrated in FIG. 1 (c) will be formed. Here, since this example uses the mask 3 having openings formed in a linear shape, the area Y enclosed with a broken line is projected in the patterned film 1A, as illustrated in FIG. 1 (d).

Special feature of the present invention is the shift of at least a part of the photosensitive resin composition in the unexposed area to the exposed area. Shift of at least a part of the photosensitive resin composition in the unexposed area to the exposed area provides the patterned film having projected and depressed patterns formed on the surface thereof.

In conventional pattern formation processes, a photosensitive resin composition layer in an unexposed area was removed by development, and thereby a patterned film comprising the photosensitive resin composition layer that remained in an exposed area was obtained. In contrast to the conventional pattern formation processes, in the process for producing the patterned film of the present invention, the patterned film having projected and depressed patterns formed on the surface thereof may be obtained, for example, without development. Therefore, necessity for a large amount of developing solution may be eliminated, and reduction of environmental load will be achieved. Furthermore, elimination of the necessity for the process of development and of the necessity for drying process performed after the development can achieve efficient production of the patterned film, leading to omission of preparation of extraordinary development facilities. Since the patterned film having projected and depressed patterns formed on the surface thereof may be obtained without development in the process for producing the patterned film of the present invention, the development process may preferably be avoided. However, for example, when the uncured photosensitive resin composition remains in the unexposed area, the developing process may also be performed.

In the process for producing the patterned film of the present invention, even when development is performed, at least a part of the photosensitive resin composition in the unexposed area shifts to the exposed area, and the amount of the photosensitive resin composition that exists in the unexposed area, that is, the amount of the photosensitive resin composition that has not been cured, will be reduced, resulting in decrease of the amount of photosensitive resin composition removed by development. Accordingly, the amount of the photosensitive resin composition to be used and the environmental load may be reduced.

Here, examples of the above-described operation of development include various operations of processing the photosensitive resin composition layer with an organic solvent, such as an operation of immersion of the photosensitive resin composition layer having a latent image formed therein into an organic solvent, an operation of washing out of the surface of the photosensitive resin composition layer by an organic solvent, an operation of spraying of an organic solvent to the surface of the above-described photosensitive resin composition layer, etc.

Here, not only organic solvents but alkaline aqueous solutions and acidic aqueous solutions may also be used, as the developing solution. As the organic solvent, PEGMEA (propylene glycol-1-monomethyl ether-2-acetate), lactic acid ethyl ester, ethyl acetate, tetrahydrofuran, toluene, etc. may be mentioned. A tetramethylammonium hydroxide aqueous solution, a sodium silicate solution, an aqueous solution of sodium hydroxide, an aqueous solution of potassium hydroxide, etc. may be mentioned, as the alkaline aqueous solution. Oxalic acid, formic acid, acetic acid, glycolic acid, tartaric acid, lactic acid, malonic acid, etc. may be mentioned, as the acidic aqueous solution.

The duration needed for development is dependent on the thickness of the photosensitive resin composition layer, or the type of the solvent, and it is preferably in the range of 10 seconds to 5 minutes, for development with satisfactory efficiency, and improved producing efficiency. The developing solution remaining on the patterned film is preferably removed by washing using methanol, ethanol, isopropyl alcohol, or distilled water.

Here, in order to obtain the patterned film having an outstanding projected and depressed pattern shape, at least a part of the photosensitive resin composition layer preferably projects in the exposed area, and at least a part of the photosensitive resin composition layer preferably depresses in the unexposed area to form the projected and depressed pattern on the surface in the step of obtaining the patterned film.

The photosensitive resin composition of the present invention comprises a curing resin curable by the action of an acid or a base, and a photoacid or a photobase generator for generating the acid or the base by irradiation of light. The photosensitive resin composition of the present invention is preferably used for the process for producing the patterned film of the present invention.

The blending proportion of the above-described curing resin is preferably in the range of 10 to 99.9% by weight to 100% by weight of the photosensitive resin compositions. If the curing resin is less than 10% by weight, it may lead to possible precipitation of the photoacid or photobase generator, or the acid or base proliferating agent. If the curing resin exceeds 99% by weight, it may provide inferior curing property. It is preferably 30 to 90% by weight, and more preferably 50 to 80% by weight.

The above-described curing resin is not in particular limited, and epoxy compounds, acrylate oligomers, isocyanate oligomers, alkoxy silanes and partial condensates of the alkoxy silanes, etc. may be mentioned.

Of the above-described compounds, epoxy compounds that provide efficient progress of cross linking reaction by the action of the base are more preferably used.

The above-described epoxy compound is not in particular limited, and examples of the epoxy compounds include: BPF type epoxy resins, BPA type epoxy resins, BPF type epoxy resins, novolak type epoxy resins, such as novolak epoxy oligomers, brominated epoxy resins, flexible epoxy resins as described in the catalog by Tohto Kasei Co., Ltd.; Epicoat basic solid type, Epicoat bis F solid type as described in the catalog by Yuka Shell Epoxy KK Company; EHPE alicyclic solid epoxy resins as described in the catalog by Daicell Chemical Industries, LTD. etc.

Furthermore, examples of the above-described epoxy compounds include liquid epoxy resins: DENACOL series, that is, EX-611, EX-612, EX-614, EX-614B, EX-614, EX-622, EX-512, EX-521, EX-411, EX-421, EX-313.EX-314, EX-321, EX-201, EX-211, EX-212, EX-252, EX-810, EX-811, EX-850, EX-851, EX-821, EX-830, EX-832, EX-841, EX-861, EX-911, EX-941, EX-920, EX-721, EX-221, EM-150, EM-101, EM-103 as described in the catalog by Nagase Chemtex Corp.; YD-115 and YD-115G, YD-115CA, YD-118T, YD-127 as described in the catalog by Tohto Kasei Co., Ltd.; EPOLIGHT series, that is, 40E, 100E, 200E, 400E, 70P, 200P, 400 P, 1500NP, 1600, 80 MF, 100MF, 4000, 3002, 1500 as described in the catalog by KYOEISHA CHEMICAL Co., LTD. etc.

Furthermore, examples of the above-described epoxy compounds include liquid epoxy resins such as alicyclic epoxy compounds: CELLOXIDE 2021, CELLOXIDE 2080, CELLOXIDE 3000, EPOLEAD GT300, EPOLEAD GT400, EPOLEAD D-100ET, EPOLEAD D-1000T, EPOLEAD D-100DT, EPOLEAD D-100ST, EPOLEAD D-200HD, and EPOLEAD D-200E, EPOLEAD D-204P, EPOLEAD D-210P, EPOLEAD D-210P, EPOLEAD PB3600, EPOLEAD PB4700 as described in the catalog by Daicel Chemical Industries, Ltd.

Of the above-described curing resins, novolak epoxy oligomers may more preferably be used. As the novolak epoxy oligomers, oligomers having 500 to 50,000 of weight average molecular weight (Mw) may be preferably used. The photosensitive resin composition of the present invention more preferably comprises the novolak epoxy oligomer represented with following formula (3) (YDCN-701, Mw=2100, Mw/Mn=1.58, n≈10). Here, Mn designates a number average molecular weight.

(3)

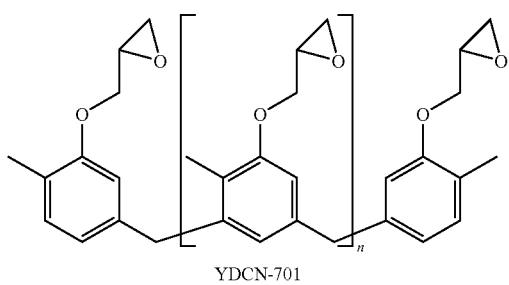

YDCN-701

The blending proportion of the above-described a photoacid or a photobase generator is preferably in the range of 0.1 to 80% by weight to 100% by weight of the photosensitive resin composition. Less than 0.1% by weight of the photoacid or photobase generator may only generate excessively smaller amount of the acid or base. The amount exceeding 80% by weight of the photoacid or photobase generator may be excessive for getting the addition effect of the photoacid or photobase generator. More preferably, this amount is in the range of 1 to 30% by weight.

Photoacid generators to be used as the above-described photoacid or photobase generator are not in particular limited, and for example, onium salts etc. may be mentioned. In more detail, salts of diazonium, phosphonium, and iodonium of $BF_4^-$, $PF_6^-$, $SBF_6^-$, and $ClO_4^-$ etc. and organic halogen compounds, organic metals, organic halogenated compounds, etc. may be mentioned.

The above-described photoacid generators are not in particular limited, and examples of the photoacid generators include: sulfonium salt compounds, such as triphenylsulfonium trifluoromethanesulfonate, triphenylsulfonium trifluoromethanantimonate, triphenylsulfonium benzosulfonate, cyclohexylmethyl(2-oxocyclohexyl)sulfonium trifluoromethanesulfonate, dicyclohexyl(2-oxocyclohexyl)sulfonium trifluoromethanesulfonate, dicyclohexyl sulfonylcyclohexanone, dimethyl(2-oxocyclohexyl)sulfonium trifluoromethanesulfonate etc.; iodonium salts, such as diphenyliodonium trifluoromethanesulfonate; N-hydroxysuccinimide trifluoromethanesulfonate etc. These acid generators may be used independently and two or more kinds may be used in combination. Furthermore, publicly known sensitizers may be used. As suitable sensitizers for the present invention, aromatic polycyclic compounds, porphyrin compounds, phthalocyanine compounds, poly methine pigment compounds, merocyanine compounds, coumarin compounds, thio pyrylium compounds, pyrylium compounds, p-dialkylamino styryl compounds, thioxanthen compounds, etc. may be mentioned, and examples are not limited to them.

The above-described photoacid generators are not in particular limited, and at least one kind of compound selected from the group consisting of onium salts, diazonium salts, and sulfonic acid esters having higher reactivity may preferably be used.

The above-described photobase generators are not in particular limited, and conventionally known o-nitrobenzyl type photobase generators, (3,5-dimethoxybenzyloxy) carbonyl type photobase generators, amyloxy imino type photobase generators, dihydropyridine type photobase generators etc. may be mentioned. Especially owing to outstanding convenient property in base generating efficiency and synthesis, o-nitrobenzyl type photobase generator is preferably used.

Since at least a part of the photosensitive resin composition in the unexposed area more efficiently shifts to the exposed area, the photosensitive resin composition of the present invention more preferably comprises the photobase generator represented with the above-described formula (1).

The photoacid or photobase generator that generates the acid or base by irradiation of light preferably generates the acid or base by heat. When the photoacid or photobase generator generates the acid or base by heat, heat-treatment of the photosensitive resin composition will generate the acid or base.

The blending proportion of the above-described the acid or base proliferating agent is preferably in the range of 1 to 50% by weight to 100% by weight of the photosensitive resin composition. Less than 1% by weight of the acid or base proliferating agent may provide excessively small amount of the acid or base generated by proliferation reaction, and the amount exceeding 50% by weight may precipitate the acid or base proliferating agent. More preferably, the amount is in the range of 10 to 45% by weight.

As the acid proliferating agent used as the above-described acid or base proliferating agent, for example, acid proliferating agents of benzyl sulfonate type, acetoacetic ester type, acetal type, diolmono-sulfonate type, and diol disulfonate type may be mentioned.

As the base proliferating agent used as the above-described acid or base proliferating agent, for example, 9-fluorenyl carbamate derivatives of difunctional type, spherical polyfunctional oligomer type, linear chain highpolymer type, siloxane type may be mentioned. Since at least a part of the photosensitive resin composition of the unexposed area more efficiently shifts to the exposed area, the photosensitive resin composition of the present invention more preferably comprises the base proliferating agent represented with the above-described formula (2).

The base proliferating agent represented with the above-described formula (2) decomposes by a base proliferation reaction to newly generate an amine. Furthermore, the amine generated works as a new catalyst to proliferatingly generate a large number of amines.

In the above-described formula (2), X represents a hydrogen atom, a substituted alkyl group, or an unsubstituted alkyl group. In the formula (2), a methyl group, an ethyl group, a propyl group, etc. may be mentioned as an example of X. In order for the base proliferation reaction to occur effectively, it is preferred that X is an unsubstituted alkyl group. Especially, it is more preferred that X is an ethyl group for less steric hindrance in X, and much more effective base proliferation reaction.

In the above-described formula (2), Z represents a substituted or unsubstituted alkylene group. In the formula (2), a methylene group, an ethylene group, a propylene group, etc. may be mentioned as an example of Z. In order for the above-described base proliferation reaction to occur effectively, it is preferred that Z is an unsubstituted alkylene group. Especially, it is more preferred that Z is a methylene group for less steric hindrance in Z, and much more effective base proliferation reaction.

In the above-described formula (2), n represents an integer of 1 to 4. When the base proliferating agent represented with formula (2) has a plurality of 9-fluorenyl carbamate groups in the same molecule, the base proliferation reaction occurs much more effectively by catalytic action of the generated base. Therefore, it is preferred that n is an integer of 3 or 4 in the formula (2).

As an example of the compound represented with the above-described formula (2), compounds represented with following formulae (4) and (5) may be mentioned.

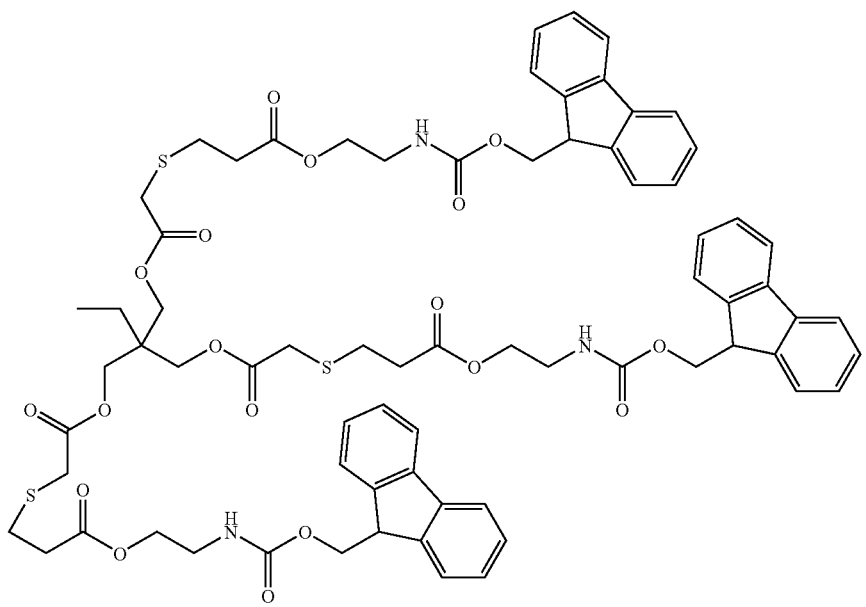

(4)

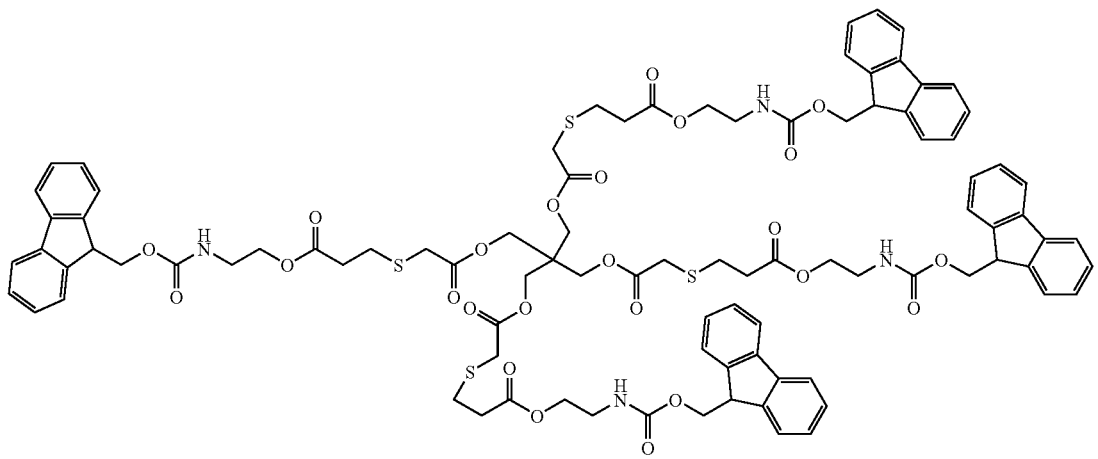

(5)

The base proliferating agents represented with the above-described formulae (4) and (5) have a plurality of 9-fluorenyl carbamate group in the same molecule. Accordingly, it has special feature that the reaction of base proliferation can easily advance by the catalytic action of the generated base. Since at least a part of the photosensitive resin composition of the present invention in the unexposed area more efficiently shifts to the exposed area, the photosensitive resin composition more preferably comprises the base proliferating agent represented with the above-described formula (4), and still more preferably it comprises the base proliferating agent represented with the above-described formula (5).

The base proliferating agents represented with the above-described formula (2), (4), or (5) are not in particular limited. For example, they may be synthesized by an addition reaction between fluorenyl methanols and isocyanate derivatives, and by an addition reaction between acrylate monomers having a fluorenyl carbamate group, and polythiol derivatives. In the former addition reaction, suitable use of a tin catalyst allows convenient synthesis of the above-described compounds. In the latter addition reaction, suitable use of a base catalyst allows convenient synthesis of the above-described compounds.

In case of the synthesis of a base proliferating agent having a value of n of 1 or 2 in formula (2), for example, on one hand, the base proliferating agent having a value of n of 1 in formula (2) may be obtained by a reaction between a monofunctional thiol derivative (X1) obtained by a reaction between commercially available n-propanol and commercially available thioglycolic acid according to following equation and an acrylate monomer.

$$CH_3CH_2CH_2OH + HSCH_2COOH \rightarrow CH_3CH_2CH_2OCOCH_2SH \quad (X1)$$

The base proliferating agent having a value of n of 2 in formula (2), on the other hand, may be obtained by a reaction between a difunctional thiol derivative (X2) obtained by a reaction between commercially available 1,3-propanediol and commercially available thioglycolic acid according to following equation and an acrylate monomer.

$$HOCH_2CH_2CH_2OH + 2HSCH_2COOH \rightarrow HSCH_2COOCH_2CH_2CH_2OCOCH_2SH \quad (X2)$$

Use of the monofunctional thiol derivative (X1) or the difunctional thiol derivative (X2) obtained by the above-described formula can provide the base proliferating agent having a value of n of 1 or 2 in formula (2).

In the photosensitive resin composition of the present invention, since at least a part of the photosensitive resin composition in the unexposed area more efficiently shifts to the exposed area, it preferably comprises the novolak epoxy oligomer represented with the above-described formula (3), the photobase generator represented with the above-described formula (1), and the base proliferating agent represented with the above-described formula (5).

The photosensitive resin composition of the present invention more preferably comprises the sensitizer. Inclusion of the sensitizer in the photosensitive resin composition improves sensitivity.

The above-described sensitizer is not in particular limited, and examples of the sensitizer include; benzophenone, p,p'-tetramethyldiaminobenzophenone, p,p'-tetraethyl aminobenzophenone, 2-chloro thioxanthone, anthrone, 9-ethoxyanthracene, anthracene, pyrene, perylene, phenothiazin, benzil, acridine orange, benzoflavin, setoflavine-T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzal acetone, 1,2-naphthoquinone, 3,3'-carbonyl-bis(5,7-dimethoxycarbonyl coumarin) and coronene etc. These sensitizers may be used independently and two or more kinds may be used in combination.

The blending proportion of the above-described sensitizer is preferably in the range of 1 to 20% by weight in 100% by weight of the photosensitive resin composition. Less than 1% by weight of the sensitizer sometimes cannot provide sufficient increasing of sensitivity. The sensitizer exceeding 20% by weight may be excessive for increasing of sensitivity.

The photosensitive resin composition of the present invention may further comprise a suitable solvent. Blending of the solvent to the photosensitive resin composition can improve application property.

The above-described solvent is not in particular limited, and examples include: aromatic hydrocarbon compounds, such as benzene, xylene, toluene, ethylbenzene, styrene, trymethyl benzene, and diethylbenzene; saturated or unsaturated hydrocarbon compounds, such as cyclohexane, cyclohexene, dipentene, n-pentane, isopentane, n-hexane, isohexane, n-heptane, isoheptane, n-octane, isooctane, n-nonane, isononane, n-decane, isodecane, tetrahydronaphthalene, and squalane; diethyl ether, di-n-propyl ether, di-isopropyl ether, dibutyl ether, ethyl propyl ether, diphenyl ether, diethylene glycol dimethyl ether, diethylene glycol diethyl ether, diethylene glycol dibutyl ether, diethylene glycol methyl ethyl ether, dipropylene glycol dimethyl ether, dipropylene glycol diethyl ether, dipropylene glycol dibutyl ether, dipropylene glycol methyl ethyl ether, ethyleneglycol dimethyl ether, ethylene glycol diethyl ether, ethylene glycol dipropyl ether, ethylene glycol methyl ethyl ether, tetrahydrofuran, 1,4-dioxane, propylene glycol monomethyl ether acetate, ethylene glycol monoethyl ether acetate, dipropylene glycol methyl ether acetate, diethylene glycol monoethyl ether acetate, ethylcyclohexane, methylcyclohexane, p-menthane, o-menthane, m-menthane; ethers, such as dipropyl ether and dibutyl ether; ketones, such as acetone, methyl ethyl ketone, methyl isobutyl ketone, diethyl ketone, dipropyl ketone, methyl amyl ketone, cyclopentanone, cyclohexanone, and cycloheptanone; esters, such as ethyl acetate, methyl acetate, butyl acetate, propyl acetate, cyclohexyl acetate, methyl cellosolve acetate, acetic acid ethylcellosolve, butyl cellosolve acetate, ethyl lactate, propyl lactate, butyl lactate, isoamyl lactate, and butyl stearate etc. These solvents may be used independently and two or more kinds may be used in combination.

The blending proportion of the above-described solvent may suitably be selected to obtain uniform coating in coating process of the photosensitive resin composition on a substrate, and in formation of the photosensitive resin composition layer.

Furthermore, other additives may be added with respect to the photosensitive resin composition of the present invention if needed. Examples of such additives include fillers, pigments, dyestuffs, leveling agents, antifoaming agents, antistatic agents, ultraviolet absorbers, pH adjusters, dispersants, distribution auxiliary agents, surface modifiers, plasticizers, plasticity accelerators, dripping inhibitors, etc.

The process for producing the patterned film of the present invention may suitably be used to form patterned films for various apparatuses. Protective films of electronic devices, alignment films of display devices, such as liquid crystal display elements, black matrices, spacers, VA projections, or protective films are preferably formed by the process for producing the patterned film of the present invention. It is more preferred that insulation protective films of electronic devices are formed by the process for producing the patterns of the present invention.

The insulation protective film having projected and depressed patterns on the surface thereof can be obtained as the insulation protective film of the above-described electronic devices, by forming patterned films by the process for producing the patterned film of the present invention. Examples of such insulation protective films of electronic devices include, for example, TFT protective films for protection of thin-film transistors (TFT), that is, passivation films, protective films for protection of filters in color filters, that is, overcoat films, protective films for organic EL devices, that is, passivation films etc.

In addition, the process for producing the patterned film using the photosensitive resin composition of the present invention may be used in applications for forming gap spacers in display devices other than liquid crystal display elements or organic EL devices, for example in field emission displays (FED), and in applications for forming patterns using photosensitive conductive paste in plasma display panels, rib pastes, or resist for sandblasting etc. Furthermore, in the case where the cured body of the photosensitive resin composition has transparency, it may be widely used for applications for forming components comprising resin patterns in optical devices. As such applications, use for fabricating patterns of portion for formation of optical diffusing plates, prism lens sheets, light guide plates, retardation plates, lenticular sheets, micro lens arrays, birefringent films, refractive index inclination sheets, patterns of a part of light path forming portions of optical switches, non reflective films and a part of light path forming portions of hologram elements etc. may be mentioned.

The process for producing the patterned film of the present invention may be used for application for forming projected and depressed patterns in the surface in optical discs etc. The process for producing the patterned film using the photosensitive resin composition of the present invention may also be used for biofilms or biochips used in medical applications that need patterned films. In addition to electronic and electric applications, optical applications, and biomedical applications, the process for producing the patterned film of the present invention may be used also for general surface decoration applications. Furthermore, it may also be used for various pattern formation applications, such as patterning of the original plate of printing in relief printing or intaglio printing, formation of pattern for prevention of forged notes, mold patterns in formation of resin made mold, abrasive tapes formed by patterning, removable adhesives having an adhesive partially formed by patterning etc.

The process for producing the patterned film of the present invention may preferably and advantageously be used, for example, in application of bonding, in lamination of a plurality of semiconductor device chips, by providing partially a bonding agent for bonding between semiconductor device chips onto a semiconductor device chip downside, in application of formation of micro lens arrays of image sensors including the micro lens arrays mentioned above, in application of partially forming a resin-made bonding agent layer for reinforcing the circumference of bumps in flip chip bonding of electronic component elements, such as semiconductor device chips, in application of formation of a frame shape dam materials for enclosing the circumference of photoreceptor area in the above-described image sensors etc.

Conventionally, since bumps obtained by formation of a conductive coating film on the surface of a resin core has elasticity, they are known as bumps having a function for relaxing a stress. When a plurality of bumps having such a resin core is formed, it is necessary to form a plurality of resin cores on a substrate. The process for producing the patterned film concerning the present invention may advantageously be used for such an application. That is, a plurality of resin cores are formed in accordance with the process for producing the patterned film of the present invention, subsequently the surface of the resin cores are covered with a conductive coating film, and thus a plurality of bumps having elasticity may easily be formed with high precision.

Alternatively, a structure obtained by forming the above-described resin cores using the process for producing the patterned film of the present invention, and then by forming resin cores having conductive coating film formed on the surface thereof may also be used, for example, as a via-hole electrode of a layered substrate. That is, after formation of a bump having elasticity and having the above-described resin core on a substrate, the bump is forced to protrude into an uncured insulating resin layer, and subsequently the insulating resin layer is cured, and thereby a via-hole electrode comprising the above-described bump may be formed in a layered substrate.

Detailed examples of use of patterned films obtained by the process for producing the patterned film of the present invention in the above described electronic devices will be described with reference to drawings. FIG. 6 is a partial cross-sectional front sectional view of a publicly known liquid crystal display element. A liquid crystal display element 11 has mutually facing glass substrates 12 and 13. A liquid crystal 14 is charged between the glass substrates 12 and 13. A polarization film 15 is laminated on an outer surface of one of the glass substrate 12, and a TFT 16 is formed in an interior surface of the glass substrate 12. The TFT 16 is illustrated in FIG. 6 in a schematic illustration, and it is a field effect transistor formed using a method for forming a thin film. An alignment film 17 is formed on the upper surface of the glass substrate 12, and an electrode 18 comprising ITO for forming pixels is formed.

On the other hand, a polarization film 18 is laminated on an outer surface of the glass substrate 13, and a green color filter G and a red color filter R are formed on an interior surface side in the liquid crystal display element 11. A blue color filter, not illustrated in FIG. 6, is also provided on the interior surface of the glass substrate 13.

Furthermore, a black matrix 20 is disposed between the color filter G and the color filter R. This black matrix 20 is a part that divides pixels in a shape of a grid, and also is a light-shielded area. In an area having the black matrix 20 provided therein, a spacer 21 is provided being separated from the part having the TFT 16 formed therein in a direction perpendicular to the plane of a paper in FIG. 6. The spacer 21 is disposed in order to keep a constant distance between the glass substrates 13 and 12.

Here, in order to enclose the liquid crystal 14, a sealing material 22 is provided. In such liquid crystal display element 11, the process for producing the patterned film of the present invention may advantageously be used in formation of the black matrix 20 and the spacer 21 on the above-described glass substrate 13. For example, as illustrated reversed upside down in FIG. 7 (a), the glass substrate 13 is disposed, so that the interior surface may face upward, to form the black matrix on the glass substrate 13, and a photosensitive resin composition layer 20A consisting of an insulating photosensitive resin composition in accordance with the present invention is coated, and then is exposed using a mask 23. The mask 23 has an opening 23a. Since an exposed area is cured and the part of the photosensitive resin composition in an unexposed area shifts toward the exposed area, a pattern of the black matrix 20 corresponding to the opening 23a of the above-described mask 23 may be formed as illustrated in FIG. 7 (*b*).

Next, as illustrated in FIG. 8 (*a*), after formation of the above-described black matrix 20, the color filters G and R etc. are formed so that they may be divided by the black matrix 20. After that, the resin composition layer 25A consisting of the photosensitive resin composition of the present invention is coated onto the whole surface. Subsequently, the photosensitive resin composition layer 25A is selectively exposed with light using a mask 24. The mask 24 has an opening 24a. Furthermore, in the mask 24, an area other than the area having the opening 24a provided thereto has a light-shielded area 24b that completely shields the light, and a half light-shielded area 24c that has lower shielding performance compared with that of the light-shielded area 24b. On one hand, the exposed photosensitive resin composition is cured in the area having the opening 24a. On the other hand, the unexposed photosensitive resin composition downward of the light-shielded area 24b shifts to a side of the exposed photosensitive resin composition. The photosensitive resin composition downward of the half light-shielded area 24c also shifts to the photosensitive resin composition side in the exposed area. In this case, since the photosensitive resin composition downward of the light-shielded area 24b is not exposed with the light at all, it maintains sufficient flowability, and therefore it immediately shifts to an adjoining side of the exposed photosensitive resin composition. In addition, although the light reaches slightly to the photosensitive resin composition downward of the half light-shielded area 24c, the photosensitive resin composition still has sufficient flowability, and thereby it will shift to an adjoining side of the photosensitive resin composition in the exposed area. Accordingly, an overcoat layer 25 may be formed so as to cover the color filters G and R, however, so as to expose the great part of the upper surface of the black matrix 20 as illustrated in FIG. 8 (*b*). That is, the overcoat layer 25 does not exist under the above-described light shielded area 24b, and at the same time, since the great part of the upper surface of the black matrix 20 is positioned under the above-mentioned half light-shielded area 24c, the overcoat layer 25 is not formed in this part. The reason why the above-described light shielded area 24b and the half light-shielded area 24c are provided is as follows: sufficiently high flowability of the synthetic resin composition is needed in an area allowing reliable removal of the photosensitive resin composition from the glass substrate 13, and the light shielded area 24b is positioned in the upper area, whereas since only the amount of thickness of the black matrix 20 may exist and the flowability of the photosensitive resin composition may slightly be reduced in the upper surface of the black matrix 20, the great part of the upper surface of the black matrix 20 is positioned under the above-described half light-shielded area 24c.

In this way, not only the light shielded area and the opening, but the half light-shielded area having light transmittance between the light shielded area and the opening may be provided in selective exposure of the photosensitive resin composition of the present invention. In that case, two or more kinds of half light-shielded areas having different light transmittance with each other may be provided. In the patterned film obtained by selective exposure of the photosensitive resin composition, provision of such a half light-shielded area allows easy formation of areas having mutually different film thicknesses.

Next, as illustrated in FIG. 9 (*a*), a photosensitive resin composition layer 21A consisting of the insulating photosensitive resin composition formed in accordance with the present invention is further formed on the above-described overcoat layer 25 to be selectively exposed with light using a mask 26. The mask 26 has an opening 26a. Accordingly, the photosensitive resin composition is cured by exposure in an area facing the opening 26a, the photosensitive resin composition in other unexposed area will shift to the exposed area side. Therefore, the partial curing of the above-described photosensitive resin composition layer 21A can form the spacer 21 on the black matrix 20 as illustrated in FIG. 9 (*b*).

In this way, the above-described black matrix 20, spacer 21, and overcoat layer 25 may be formed, respectively, by the process for producing patterns using the photosensitive resin composition of the present invention.

In addition, as illustrated in FIG. 10, the spacer 21 may be formed by the same patterning of the photosensitive resin composition as described above after formation of an overcoat layer 25B so as to cover the upper surface of the black matrix 20. That is, the spacer 21 may be formed on the overcoat layer 25B.

In vertical alignment type liquid crystal display devices, as illustrated in FIG. 11 (*a*), a projected part 33 is provided in order to make liquid crystal molecules 32 and 32 have mutually tilted molecular chains in diagonal directions on a glass substrate 31. This projected part 33 is formed to have a shape of projected rib having a certain length in many cases, as illustrated in FIG. 11 (*b*). The process for producing patterns using the photosensitive resin composition of the present invention may also be used for formation of such a projected part 33.

In FIGS. 9 (*a*) and (*b*), in addition, the photosensitive resin composition 21A is coated on the overcoat layer 25 to be selectively exposed to the light, before formation of the spacer 21 on the black matrix 20. However, here, in providing of the photosensitive resin composition, ink-jet methods other than the coating method may be used. The ink-jet method is a method of applying dispersions obtained by dispersing various particles in a liquid dispersing medium, and liquids that do not include particles to a targeted position by discharge of the above-described droplet from an ink jet nozzle. The viscosity of the photosensitive resin composition of the present invention is beforehand reduced by addition of a solvent, and subsequently the photosensitive resin composition liquid 21B may be provided on the black matrix 20 using the ink-jet method, as illustrated in FIG. 12 (*a*) leading to subsequent exposure with light using the mask 34. The mask 34 has an opening 34a. On the black matrix 20, the opening 34a faces a part of areas of the upper surface of the black matrix 20. Accordingly, the photosensitive resin composition is cured in the exposed area facing the opening 34a, and the surrounding unexposed photosensitive resin composition shifts to the exposed area, leading to easy formation of a pillar-shaped spacer 21C illustrated in FIG. 12 (*b*).

In addition, the photosensitive resin composition liquid 21E including a spacer particle 21D is discharged onto the black matrix 20 by the ink-jet method and is disposed as illustrated in FIG. 13 (*a*). In this case, a dispersion liquid including the spacer particle 21D and the photosensitive resin composition 21E of the present invention is used as dispersion liquid to be discharged by the ink-jet method. The above-described dispersion liquid is discharged to dispose the above-described spacer particle 21D on the black matrix 20 by the ink-jet method. The spacer particle 21D can be formed with suitable resins, glass, etc., as long as it has a strength for uniformly setting the distance between the glass substrates facing each other.

An area on the above-described black matrix 20 is selectively exposed with light using the mask 36. As a result, the exposed area of the photosensitive resin composition 21E is cured, and then the spacer particle 21D is reliably positioned to be fixed on the black matrix 20 as illustrated in FIG. 13 (b). Since the unexposed photosensitive resin composition will shift to the upper side of the above-described black matrix 20, the protrusion, to the side of the pixel, of the photosensitive resin composition 21E that acts as a bonding agent for fixing the spacer particle 21D can reliably be avoided.

FIG. 14 is a schematic partial cross-sectional front sectional view illustrating another example of a liquid crystal display element. This liquid crystal display device 41 has a TFT 43 and a pixel 44 driven by the TFT 43 on the under surface of a glass substrate 42. In the liquid crystal display element 41, a black matrix 45 for avoiding light leakage by the TFT 43 is disposed in an area facing the above-described TFT 43 on a glass substrate 46 in another side. Accordingly, the area having the black matrix 45 provided thereto is often made considerably large to include the area having the above-described TFT 43 provided therein, often reaching a part of an area overlapping with the pixel 44. Therefore, a possible problem that the overlapping of the pixel 44 in a part of the black matrix 45 reduces numerical aperture will be caused.

On the contrary, a structure is known wherein the pixel 44 is formed on an insulating resin layer 47 by formation of the insulating resin layer 47 that covers the TFT 43 as illustrated in FIG. 15. Here, the pixel 44 is disposed so as to overlap with a part of the TFT 43. Then, the TFT 43 and the pixel 44 are electrically connected through a via-hole electrode 48 provided in the insulating resin layer 47. Use of such lamination structure achieves reduction of a space and improvement in numerical aperture of a structure having the TFT 43 and the pixel 44 disposed therein.

That is, the black matrix 45 may just be formed in a small area having a size almost equivalent to that of the part overlapping with the TFT 43. Accordingly, this process can improve numerical aperture, and moreover, since the TFT 43 and the pixel 44 are laminated so as to have an partially overlapping area, a small-sized liquid crystal display element with a high density may be obtained.

Here, the process for producing patterns using the photosensitive resin composition of the present invention may advantageously be used also in formation of such an insulating resin layer 47. That is, as illustrated in FIG. 16 (a), the resin composition layer 47A consisting of the photosensitive resin composition of the present invention is coated in a structure having the TFT 43 formed on the glass substrate 42 to be subsequently exposed with light through a mask 49. The mask 49 has an opening 49a, and is open except for a part having the above-mentioned via-hole electrode 48 formed therein.

With advance of curing after exposure, the photosensitive resin composition is cured except for a part having the above-described via-hole electrode 48 formed therein, and an insulating resin composition layer 47 is formed and then a through-hole 47a is to be formed as illustrated in FIG. 16 (b). This through-hole 47a is filled with a conductive material to form the via-hole electrode 48.

In addition, the process for producing the pattern using the photosensitive resin composition of the present invention may, for example, also be used for producing of a reflecting plate in a liquid crystal display element etc. FIG. 17 (a) is a partial cross-sectional front sectional view illustrating such a reflecting plate. Here, a reflecting plate 51 has a TFT 53 formed on a glass substrate 52, and an insulating resin layer 54 having projections and depressions for forming the reflecting plate is formed. On the insulating resin layer 54, an ITO electrode 55 is formed along with the surface of the insulating resin layer 54. The ITO electrode 55 is connected to the TFT 53.

For obtaining such a structure, the photosensitive resin composition layer formed in accordance with the present invention is formed by a coating method on a glass substrate 52 having the TFT 53 formed thereon, as illustrated in FIG. 17 (b). This photosensitive resin composition layer 54A is selectively exposed with light using a mask 56. The opening 56a of the mask 56 is formed as a part equivalent to a projected part of the projections and depressions of the insulating resin layer 54 illustrated in FIG. 17 (a). Accordingly, the photosensitive resin composition 55A is cured in the exposed area to shift the photosensitive resin composition of the unexposed area, and thus the insulating resin layer 54 illustrated in FIG. 17 (a) may easily be formed.

In addition, use of the process for producing patterns of the present invention allows easy formation of a diffusing plate etc. having small projections and depressions formed on the whole surface.

In producing of diffusing plates or sheets, light is usually diffused by use of a synthetic resin film containing beads, or by formation of projections and depressions using the surface of a synthetic resin sheet having matt processing provided thereto. The diffusing plate containing the beads needs a complicated producing process, leading to a problem of higher costs. Furthermore, the matt processing has difficulty in control of projections and depressions, leading also to a problem of higher costs.

On the contrary, use of the photosensitive resin composition layer of the present invention can form a photosensitive resin composition layer 62A on a glass substrate 61 as illustrated in FIG. 18 (a), and then a diffusing plate 64 having fine projections and depressions provided on the surface thereof may be obtained by exposure through a mask 63 having a large number of through-holes 63a, as illustrated in FIG. 18 (b). That is, the diffusing plate 64 has a resin composition layer 62 having fine projections and depressions provided on the surface thereof on the above-described glass substrate 61. This fine projections and depressions may be achieved by selective exposure described above. Therefore, a diffusing plate can be provided cheaply and easily in accordance with the present invention.

Furthermore, as in a prism lens sheet 71 illustrated in FIG. 19 (a), various optical components having projections and depressions on the surface thereof can also be formed in accordance with the present invention. The prism lens sheet 71 has a prism lens part 72 in a triangular prism shape having parallel ridgelines formed on a whole surface of a glass substrate 73. The photosensitive resin composition layer 72A is formed on the glass substrate 73 to be selectively exposed with light through a mask 74 as illustrated in FIG. 19 (b). This mask 74 has an opening 74a. The opening 74a is provided in a part corresponding to the above-described prism lens part 72. Therefore, in an exposed area, the prism lens part 72 in the above-described triangular prism shape will be formed.

Furthermore, in pattern formation, such as the lens part 72 of the prism lenses, adjustment of the composition of the photosensitive resin composition layer and adjustment of exposure duration can easily adjust and control the sectional shape of projected parts 72B and 72C as illustrated in FIGS. 20 (a) and (b). That is, a ridgeline part having round shape may easily be formed as illustrated in FIG. 20 (a), or a ridgeline part having a smaller internal angle may also be easily formed as illustrated in FIG. 20 (b).

Here, the present invention may be applied for an optical component having a plurality of non-periodic projected parts 81 and 82 formed on one side, as schematically illustrated in FIGS. 21 (a) and (b). That is, the optical component 83 has projected parts 81 and 82 that are curved and non-parallel with each other on one side of a glass substrate 84. Although FIG. 21 (a) illustrates only projected parts 81 and 82, a larger number of projected portions without periodicity are disposed thereon. Such disposition of a plurality of projected parts with non-periodicity can suppress moire phenomenon. Therefore, such structure can be used advantageously for AR (antireflection film) etc. The process for producing the patterned film using the photosensitive resin composition layer of the present invention enables easy formation of patterns of such complicated non-periodicity.

Here, in production, use of the process for producing the patterned film of the present invention on a long-shaped film allows efficient producing of various patterns. In this case, a long-shaped film 91 having the photosensitive resin composition to be applied on one side is transported in an arrow direction, and is delivered to a roll 93 for exposure through a roll 92 as illustrated in FIG. 22. In a state having been contacted to the peripheral surface of the roll 93 for exposure, the above-described long-shaped film 91 is transported in an illustrated arrow direction. The long-shaped film 91 has translucency, and the exposure roll 93 also has translucency. The inner surface of the exposure roll 93 has a mask 94 disposed thereon, and the side of the mask 94 is irradiated with light from a light source 95 provided in the exposure roll 93. Then, the photosensitive resin composition layer on the above-described film 91 will be irradiated with the light through an opening 94a of the mask 94. Accordingly, the above-described selective exposure is to be performed, during the film 91 travels on the peripheral surface of the above-described exposure roll 93. In this way, the process for producing the patterned film of the present invention enables efficient production of the continuous patterned film using the long-shaped film 91.

Alternatively, as illustrated in FIG. 23 (a) a photosensitive resin composition layer 102 is formed on a long-shaped film 101, and then the layer may be selectively exposed with light, while transporting the long-shaped film 101 in a longitudinal direction along the illustrated arrow head, using a light source 103 and a mask 104.

As illustrated in FIG. 23 (b), the mask 104 has openings 104a and 104a. Accordingly, in the arrow direction in FIG. 23 (a), transportation of the above-described film 102 will provide an area in a linear shape extended in the transportation direction as an area to be exposed. Therefore, the pattern in a linear shape can easily be formed in accordance with the present invention.

Selective exposure of the photosensitive resin composition may be performed, not only by the continuous production method here illustrated in FIG. 22 and FIG. 23, but by a treatment in a batch type to form the patterned film.

As illustrated in FIG. 24, an example of a segment type display 111 of a passive type liquid crystal display element that does not have TFT has a black light-shielded area 113 formed in the circumference of a segment 112. Also in patterning for forming this black light-shielded area 113, the process for producing the patterned film of the present invention can advantageously be used. That is, the photosensitive resin composition layer of the present invention is selectively exposed with light so that a remaining area excluding a part to which the segment 112 is provided may be exposed with light, and thus the pattern corresponding to the above-described light shielded area may easily be formed.

Hereinafter, the present invention will be described in detail with reference to Examples and Comparative examples thereof. The present invention is not limited to the following Examples.

(Synthesis of Base Proliferating Agent Flu 3)

The base proliferating agent Flu 3 represented by the above-described formula (4) was synthesized in the order of following (A) to (C).

(A) Synthesis of Fluorenyl Methanol

Fluorenyl methanol was synthesized in accordance with following formula (6).

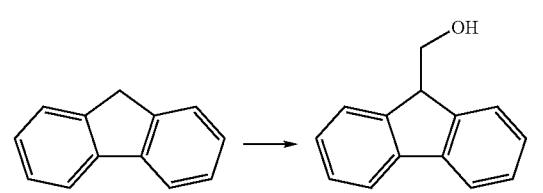

(6)

Fluorene 60 g (0.36 mol) was dissolved in dehydrated THF 1500 ml. Subsequently, butyl lithium-hexane solution 225 ml (1.6 M) was slowly dropped in at 0° C. under argon gas atmosphere. Next, paraformaldehyde 12 g was added and the mixture was agitated at a room temperature for 5 hours. After agitation, saturated sodium bicarbonate water 600 ml was added, and extracted with diethyl ether. An organic layer was washed twice with an aqueous saturated NaCl solution, and then the solvent was evaporated off after drying using anhydrous magnesium sulfate. The obtained pasty solid matter was refined by recrystallization with a mixed solvent of hexane and ethanol to obtain a white needle crystal 50 g of fluorenyl methanol. It was determined by measurement of $^1$H-NMR that the obtained compound had a structure illustrated in the above-described formula (6). The melting point and the measurement result of $^1$H-NMR will be shown in the following paragraph.

Yield 71%;

Melting point 98 to 101° C.;

$^1$H-NMR (270 MHz, CDCl$_3$) δ (ppm): 1.71 (1H, s, OH); 3.6 to 4.3 (3H, m, CH, CH$_2$); 7.2 to 7.5 (4H, m, ArH); 7.54 (2H, d, J=7.3 Hz, ArH); and 7.73 (2H, d, J=7.3 Hz, ArH).

(B) Synthesis of Acrylate Monomer

The acrylate monomer was synthesized in accordance with following formula (7).

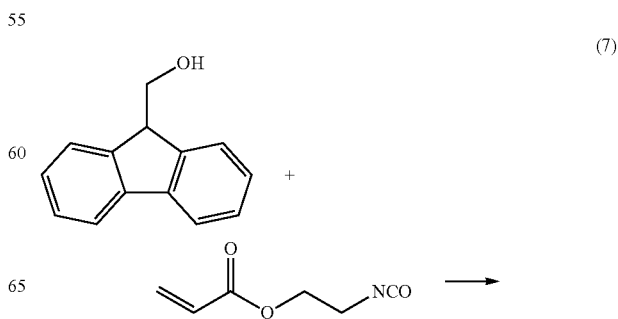

(7)

-continued

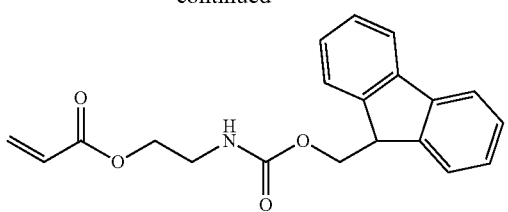

To fluorenyl methanol 2.08 g (10.6 mmol) synthesized in accordance with the above-described formula (6) dehydrated benzene 60 ml and di-n-butyl tin dilaurate as a catalyst 100 mg were added. Subsequently, a benzene solution 20 ml containing 2-isocyanate ethyl acrylate 1.41 g (10 mmol) and 2,6-di-tert-butyl-p-cresol 50 mg as a polymerization inhibitor were slowly dropped in under refluxing. The solution was cooled to a room temperature after reflux of 9 hours, and then the solvent was evaporated off. A small amount of diethyl ether and a large amount of hexane were added to the obtained brown oil. Recrystallization was performed by preservation in a freezer to obtain a white crystal of the acrylate monomer. It was determined by measurement of $^1$H-NMR that the obtained compound had a structure illustrated in the right hand side of the above-described formula (7). Melting point and the measurement result of $^1$H-NMR are shown in the following paragraph.

Yield 71%,

Melting point 101 to 103° C., $^1$H-NMR (270 MHz, CDCl$_3$) δ (ppm): 3.3 to 3.7 (2H, m, NH—CH$_2$) 4.0 to 4.6 (4H, m, O—CH$_2$); 5.06 (1H, s, NH); 5.85 (1H, d, J=10.3 Hz, C=CH$_2$); 6.0 to 6.2 (1H, m, C=CH); 6.44 (1H, d, J=17.0 Hz, C=CH$_2$); 7.1 to 7.5 (4H, m, ArH); 7.57 (2H, d, J=7.3 Hz, ArH); and 7.76 (2H, d, J=7.3 Hz, ArH).

(C) Synthesis of Base Proliferating Agent Flu 3

Base proliferating agent Flu 3 was synthesized in accordance with following formula (8).

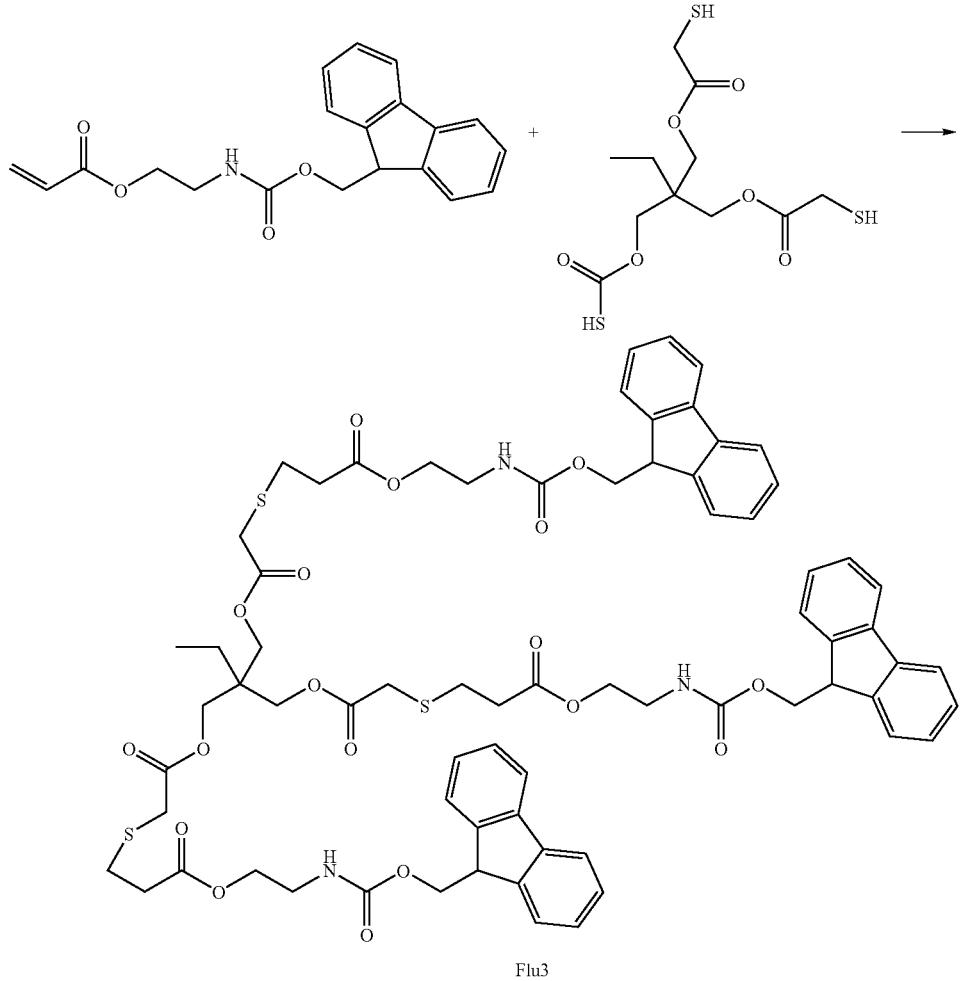

Flu3

(8)

The acrylate monomer synthesized in accordance with the above-described formula (8) 0.36 g (1.0 mmol), TMTG (trithiol derivative) 1.0 g (3.0 mmol), and tri-n-butylamine 19 mg (0.1 mmol) as a catalyst were dissolved in dehydrated dichloromethane 7 ml, and the mixture was agitated for four days at a room temperature. After agitation, the mixture was washed with 2 M hydrochloric acid, and subsequently an aqueous saturated NaCl solution. The mixture was dried using anhydrous magnesium sulfate. Subsequently, an oil obtained by evaporation off of the solvent under a reduced pressure, and then was frozen in a freezer to obtain the Flu 3.

It was determined by measurement of $^1$H-NMR and MALDI that the obtained compound had a structure illustrated in the right hand side of the above-described formula (4) and formula (8). Measurement results of $^1$H-NMR and MALDI are illustrated as follows.

(Flu3)

Colorless oil,

Yield 89%, $^1$H-NMR (270-MHz, CDCl$_3$) δ (ppm): 0.8 to 1.2 (3H, m, CH$_3$); 1.4 to 1.6 (2H, m, CH$_2$); 2.5 to 2.8 (6H, m, CH$_2$); 2.8 to 3.1 (6H, m, CH$_2$); 3.2 to 3.6 (12H, m, CH$_2$); 4.0 to 4.6 (18H, m, CH$_2$); 5.2 to 5.5 (3H, m, NH); 7.2 to 7.5 (12H, m, ArH); 7.58 (6H, d, J=7.3 Hz, ArH); and 7.74 (6H, d, J=7.3 Hz, ArH).

MALDI (m/z): 1390.1 (M+Na)$^+$, 1406.1 (M+K)$^+$.

(Synthesis of Base Proliferating Agent Flu 4)

Base proliferating agent Flu 4 represented by the above-described formula (5) was synthesized in the following manner. The base proliferating agent Flu 4 was synthesized in accordance with following formula (9).

evaporation off of the solvent under a reduced pressure, and then was frozen in a freezer to obtain the compound Flu 4. It was determined by measurement of $^1$H-NMR and MALDI that the obtained compound had a structure illustrated in the right hand side of the above-described formula (5) and formula (9). Measurement results of $^1$H-NMR and MALDI are illustrated as follows.

(Flu4)

Colorless oil,

Yield 72%, $^1$H-NMR (270-MHz, CDCl$_3$) δ (ppm): 2.5 to 2.8 (8H, m, CH$_2$); 2.8 to 3.1 (8H, m, CH$_2$); 3.2 to 3.6 (16H, m, CH$_2$); 4.0 to 4.6 (24H, m, CH$_2$); 5.3 to 5.5 (4H, m, NH); 7.2 to 7.5 (16H, m, ArH); 7.60 (8H, d, J=7.3 Hz, ArH); and 7.77 (8H, d, J=7.3 Hz, ArH).

MALDI (m/z): 1804.5 (M+Na)$^+$), 1820.5 (M+K)$^+$).

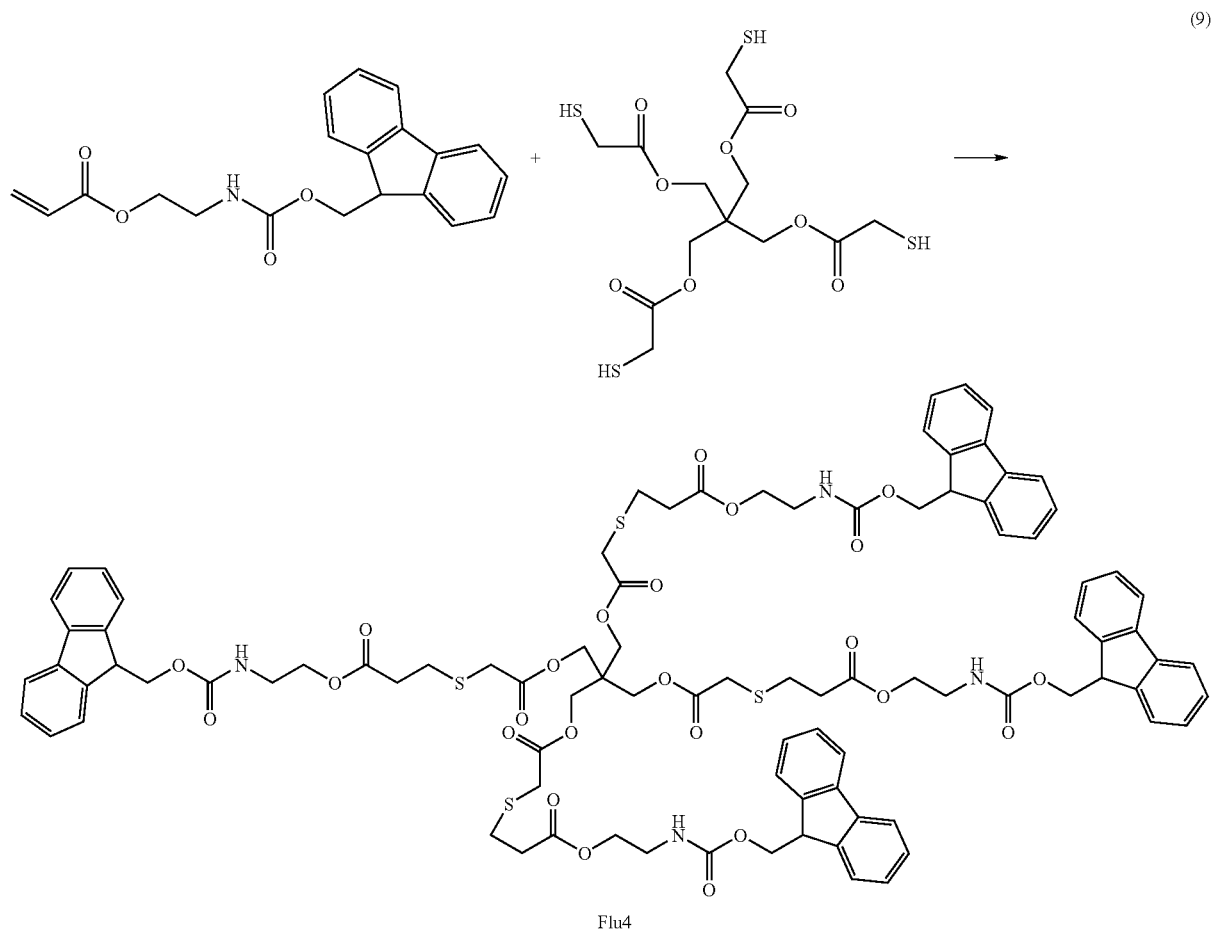

Flu4

The acrylate monomer 2.0 g (6.0 mmol) synthesized in accordance with formula (7), PETG (tetra thiol derivative) 0.65 g (1.5 mmol), and tri-n-butylamine 40 mg as a catalyst were dissolved in dehydrated dichloromethane 15 ml, and was agitated for three days at a room temperature. After agitation, the mixture was washed with 2 M hydrochloric acid, and, subsequently was washed with an aqueous saturated NaCl solution. Subsequently, the mixture was dried using anhydrous magnesium sulfate. Next, an oil obtained by Example 1

A novolak epoxy oligomer (YDCN-701) 100 parts by weight, represented with the above-described formula (3); a photobase generator (PBG) 10 parts by weight, represented with the above-described formula (1); and a base proliferating agent 45 parts by weight, represented with the above-described formula (5) were dissolved in a solvent having a composition of PEGMEA (propylene glycol-1-monomethyl ether-2-acetate): $CHCl_3$=4:5 (weight ratio) 900 parts by weight, and thus a photosensitive resin composition A was obtained.

Next, the above-described photosensitive resin composition A was spin cast over 30 seconds at a number of rotations of 1000 rpm on a substrate, and subsequently, was heated for 1 minute on a hot plate at 100° C. to form a photosensitive resin composition layer having a film thickness of 1170 nm.

Next, a photomask as illustrated in FIG. 1 (b) were prepared, in detail: a photomask 3A having linearly formed openings with 500 µm and areas without opening with 500 µm, the openings and areas without openings being alternately formed, and a photomask 3B having linearly formed openings with 100 µm and areas without opening with 100 µm, the openings and areas without openings being alternately formed.

The photosensitive resin composition layer was selectively exposed with ultraviolet rays of 365 nm and 450 mJ/cm² through the above-described photomask 3A or photomask 3B. Subsequently, the layers were heat-treated for 20 minutes at 130° C. (PEB treatment), and patterned films were obtained.

The patterned films obtained using the photomask 3A or the photomask 3B were measured for the height profile using a surface roughness meter, respectively. FIG. 2 (a) illustrates the height profile of the patterned film obtained using the photomask 3A, and FIG. 2 (b) illustrates the height profile of the patterned film obtained using the photomask 3B.

As illustrated in FIGS. 2 (a) and (b), at least a part of the photosensitive resin composition in an unexposed area shifted to an exposed area to form a patterning image. That is, the surface of the patterned film had projected and depressed patterns formed thereon. Furthermore, in the patterned film obtained using the photomask 3B, the photosensitive resin composition layer projected in the exposed area, and the photosensitive resin composition layer depressed in the unexposed area. Here, the projected portion of the exposed area and the depressed portion of the unexposed area were formed with almost the same intervals to provide an excellent pattern shape.

Example 2

After the selective exposure of the photosensitive resin composition layer, the same process as that in Example 1 was repeated to obtain patterned films, except for duration of the PEB treatment having been changed to 5 minutes, 7 minutes, 10 minutes, 15 minutes, or 20 minutes.

The patterned films obtained by the PEB treatment for 5 minutes, 7 minutes, 10 minutes, 15 minutes, or 20 minutes (the same as in Example 1) using the photomask 3A or the photomask 3B were measured for the height profile, using a surface roughness meter. FIGS. 3 (a) to (e) illustrate the height profiles of the patterned films obtained using the photomask 3A, respectively, and FIGS. 4 (a) to (e) illustrate the height profile of the patterned film obtained using the photomask 3B, respectively.

As illustrated in FIGS. 3 (a) to (e) and FIGS. 4 (a) to (e), at least a part of the photosensitive resin composition in the unexposed area shifted to the exposed area to form the patterning image. Furthermore, it was confirmed that the PEB treatment for about 7 to 15 minutes caused mass transfer most efficiently, and sharply demonstrated patterning images.

That is, it is understood that the crosslinking reaction of the novolak epoxy oligomer sufficiently advanced, during the PEB treatment for 7 to 15 minute to polymerize the exposed area, and therefore the unreacted epoxy oligomer was spread from the unexposed area to the exposed area based on the concentration gradient, resulting in formation of excellent patterning images. It was confirmed that in this system, the PEB treatment for about 15 minutes completed the formation of the patterning images accompanying mass transfer, and that heating of further heating duration failed to vary the patterning images.

Example 3

The same process as that in Example 1 was repeated to prepare a photosensitive resin composition B, except for having changed the mixed amount of the novolak epoxy oligomer (YDCN-701) into 100 parts by weight, and having changed the composition of the solvent into PEGMEA (propylene glycol 1-monomethyl-ether-2-acetate): $CHCl_3$=9:10 (weight ratio) and the amount into 1900 parts by weight. The same process as that in Example 1 was repeated to prepare a photosensitive resin composition C, except for having changed the mixed amount of the novolak epoxy oligomer (YDCN-701) into 100 parts by weight, and having changed the composition of the solvent into PEGMEA (propylene glycol 1-monomethyl-ether-2-acetate): $CHCl_3$=3:5 (weight ratio), and the amount into 400 parts by weight.

Next, each photosensitive resin compositions B and C were spin cast over 30 seconds, respectively, at number of rotations of 1000 rpm on a substrate. Subsequently, each resin composition was dried for 1 minute on a hot plate at 100° C. to form a photosensitive resin composition layers, each having a film thickness of 370 nm (use of photosensitive resin composition B) and a film thickness of 4380 nm (use of photosensitive resin composition C).

Each photosensitive resin composition layer was selectively exposed through the above-described photomask 3B with ultraviolet rays of 365 nm and 450 mJ/cm². Subsequently, the layers were heat-treated for PEB treatment for 20 minutes at 130° C., and patterned films were obtained.

The obtained patterned films were measured for the height profile using a surface roughness meter, respectively. FIGS. 5 (a) to (c) illustrate the height profile of the patterned films obtained from the photosensitive resin composition layers respectively having a film thickness of 370 nm (use of photosensitive resin composition B), a film thickness of 1170 nm (use of photosensitive resin composition A, the same as in Example 1), and a film thickness of 4380 nm (photosensitive resin composition C).

Example 4

A novolak epoxy oligomer (YDCN-701) 43 parts by weight, bis{p-(t-buthylphenyl)}iodonium hexafluorophosphate 3.2 parts by weight as a photoacid generator, and 9,9'-diethoxyanthracene 3.6 parts by weight as a sensitizer were dissolved in PEGMEA (propylene glycol-1-monomethyl ether-2-acetate) 243 parts by weight, to obtain a photosensitive resin composition. This photosensitive resin composition was spin cast over 30 seconds at a number of rotations of 1000 rpm on a glass substrate, and was dried with hot air to obtain a thin film. The photosensitive resin composition layer was selectively exposed with ultraviolet rays of 365 nm and 20 mJ/cm² through a photomask in the same manner as in Example 1. Subsequently, the layer was heat-treated for 10 minutes at 130° C. (PEB treatment). A projected and depressed pattern film having a film reduction area corresponding to the photomask in the unexposed area was obtained.

Example 5

The same process as that in Example 1 was repeated except for having changed the base proliferating agent into a base proliferating agent having the structure illustrated in the above-described formula (4), a photosensitive resin composition was obtained. The composition was evaluated as in Example 1. Following Table 1 shows results.

In evaluation, the photosensitive resin composition layer was selectively exposed with ultraviolet rays of 365 nm and 450 mJ/cm² through the photomask 3B used in Example 1, and subsequently, the photosensitive resin composition layer was measured for the thickness (a thickness before baking). Then, the layer was PEB treated for 20 minutes at 130° C. to obtain a patterned film. The layer was measured for a thickness in the exposed area (a thickness after baking in the exposed area) and a thickness in the unexposed area (a thickness after baking in the unexposed area). The thicknesses were measured with a surface roughness meter.

Example 6 to Example 18

The same process as that in Example 1 was repeated except for having changed the blending proportion of the used novolak epoxy oligomer (YDCN-701), and the types and the blending proportions, of other epoxy resins, photoacid generators, or photobase generators into contents as shown in the following Table 1, to obtain photosensitive resin compositions. The compositions were evaluated as in Example 1. Following Table 1 shows results.

Here, experiments were performed in a same manner as in Example 5 for comparison, except for having used an acrylic resin compositions illustrated in following Table 1, that is, mixture of polypropylene glycol diacrylate (ARONIX M-270 manufactured by TOAGOSEI CO., LTD.) 100 g and a photoinitiator (CIBA SPECIALTY CHEMICALS, IRGACURE 819) 2 g, in replacement of the above-described photosensitive resin composition. However, satisfactory patterns could not be obtained without development.

Details of notations in Table 1 will be given as follows.
Bisphenol A type epoxy resin (828): manufactured by Japan Epoxy Resins Co., Ltd., Epicoat 828
Bisphenol F type epoxy resin (806): manufactured by Japan Epoxy Resins Co., Ltd., Epicoat 806
Styrene macro monomer SM: manufactured by TOAGOSEI CO., LTD., macro monomer AS-6
BA: Base proliferating agent
PBG: Photobase generator
PAG: Photoacid generator

What is claimed is:

1. A process for producing a patterned film, comprising:
   a step of preparing a photosensitive resin composition to be cured by generating an acid or a base by irradiation of light;
   a step of forming the photosensitive resin composition layer having a predetermined thickness by applying the photosensitive resin composition on a substrate; and
   a step of obtaining a patterned film having projected and depressed patterns formed on the surface thereof, wherein, by selective exposure of the photosensitive resin composition layer with light through a mask, at least a part of the photosensitive resin composition in an unexposed area is shifted to an exposed area, and then the photosensitive resin composition is cured.

2. The process for producing the patterned film according to claim 1, wherein the photosensitive resin composition layer is heat-treated after selective exposure of the photosensitive resin composition layer with light through the mask, in the step of obtaining the patterned film.

TABLE 1

| | | Example | | | | | | | | | | | | | Comparative Example |
|---|---|---|---|---|---|---|---|---|---|---|---|---|---|---|---|
| | | 5 | 6 | 7 | 8 | 9 | 10 | 11 | 12 | 13 | 14 | 15 | 16 | 17 | 18 | |
| Composition | Novolak Type Epoxy Resin (YDCN) | 100 | | | | 10 | | | | | | | | | | Acrylic: Polypropylene Glycol Diacrylate (100 g) + Optical Radical Generator: IRGACURE 819 (2 g) |
| | Bisphenol A Type Epoxy Resin (828) | | | | | | | | | | 10 | | | | | |
| | Bisphenol F Type Epoxy Resin (806) | | | | | | | | | | | | 10 | | | |
| | Tetra Epoxysilane | | | | | | | | | | | | | 10 | | |
| | Styrene Macro Monomer SM | | | | | | | | | | | | | | 10 | |
| | Base Proliferating Agent (BA) | 45 | | | 4.5 | | | 9 | | | 4.5 | | 4.5 | | 4.5 | |
| | Photobase Generator (PBG) | 10 | | 1 | | | | 1 | | | 1 | | 1 | | 1 | |
| | Photoacid Generator (PAG) | | | | | | | | | 1 | | 1 | | 0.2 | | |
| Conditions | Exposure Energy (mJ/cm²) | 450 | | | | 500 | | | | | 500 | | 50 | | 500 | |
| | Heating Temperature (° C.) | 130 | | | 130 | | | 100 | | | | | 130 | | | |
| | Heating Period (min) | 20 | 1 | 3 | 10 | 15 | | 10 | 15 | 7 | 2 | 15 | 2 | | 10 | |
| Evaluation | Thickness before Baking(μm) | 0.36 | | 0.37 | | 0.82 | 1.04 | 0.6 | 0.34 | 0.45 | 0.59 | 0.15 | 0.65 | 0.49 | 0.72 | |
| | Thickness after Baking in Exposed Area(μm) | 0.45 | 0.44 | 0.62 | 1.01 | 1.35 | 2.2 | 1.14 | 0.5 | 0.51 | 0.74 | 0.33 | 1.12 | 0.83 | 1.35 | |
| | Thickness after Baking in Unexposed Area(μm) | 0.28 | 0.33 | 0.13 | 0 | 0.07 | 0.2 | 0.19 | 0.16 | 0.3 | 0.49 | 0.02 | 0.32 | 0.22 | 0.13 | |

(Blending proportion of composition in part by weight)

3. The process for producing the patterned film according to claim 1, wherein at least a part of the photosensitive resin composition layer projects in the exposed area, and at least a part of the photosensitive resin composition layer depresses in the unexposed area to form the projected and depressed patterns on the surface thereof, in the step of obtaining the patterned film.

4. The photosensitive resin composition used for the process for producing the patterned film according to claim 1, comprising:
   a curing resin to be cured by an action of an acid or a base; and
   a photoacid or a photobase generator for generating the acid or the base by irradiation of light.

5. The photosensitive resin composition according to claim 4, further comprising an acid or a base proliferating agent for proliferatingly generating an acid or a base by an action of the acid or the base.

6. The photosensitive resin composition according to claim 4, wherein the curing resin is a novolak epoxy oligomer.

7. The photosensitive resin composition according to claim 4, wherein the photoacid or photobase generator is a photobase generator represented with a following formula (1)

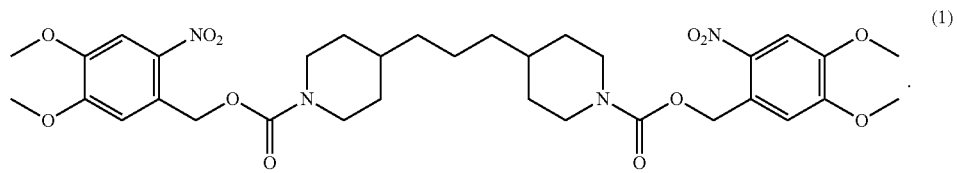

(1)

8. The photosensitive resin composition according to claim 5, wherein the acid or base proliferating agent is a base proliferating agent represented with a following formula (2):

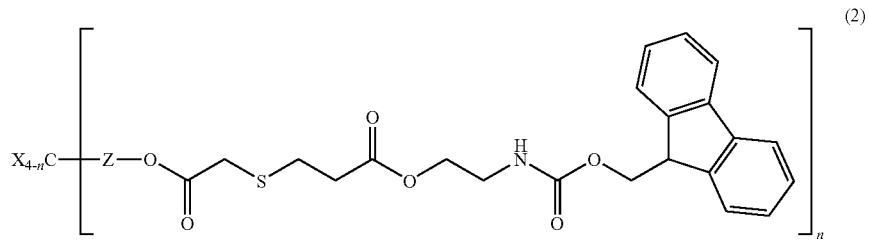

(2)

(where, X represents a hydrogen atom, a substituted alkyl group or an unsubstituted alkyl group, Z represents a substituted or an unsubstituted alkylene chain, and n represents an integer of 1 to 4).

* * * * *